(12) United States Patent
Ryu

(10) Patent No.: US 12,300,129 B2
(45) Date of Patent: May 13, 2025

(54) TILED DISPLAY DEVICE

(71) Applicant: Samsung Display Co., Ltd., Yongin-si (KR)

(72) Inventor: Tae Yong Ryu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 726 days.

(21) Appl. No.: 17/449,914

(22) Filed: Oct. 4, 2021

(65) Prior Publication Data

US 2022/0208033 A1   Jun. 30, 2022

(30) Foreign Application Priority Data

Dec. 30, 2020   (KR) .................. 10-2020-0186995

(51) Int. Cl.
*G09F 9/302* (2006.01)
*G09F 9/33* (2006.01)
*H10H 20/84* (2025.01)
*H10H 20/858* (2025.01)

(52) U.S. Cl.
CPC .............. *G09F 9/3026* (2013.01); *G09F 9/33* (2013.01); *H10H 20/84* (2025.01); *H10H 20/8581* (2025.01)

(58) Field of Classification Search
CPC ......... G09F 9/3026; G09F 9/33; H01L 33/44; H01L 33/641
USPC ........................................................ 359/288
See application file for complete search history.

(56) References Cited

U.S. PATENT DOCUMENTS

2019/0198732 A1* 6/2019 Shimizu .............. H01L 25/0753

FOREIGN PATENT DOCUMENTS

| CN | 103885209 A | * | 6/2014 | .......... G02F 1/0147 |
|---|---|---|---|---|
| KR | 10-2006-0072737 A | | 6/2006 | |
| KR | 10-2017-0080962 A | | 7/2017 | |
| KR | 10-1895522 B1 | | 10/2018 | |
| KR | 10-2018-0128550 A | | 12/2018 | |
| KR | 10-2019-0072198 A | | 6/2019 | |
| KR | 10-2019-0072199 A | | 6/2019 | |

* cited by examiner

*Primary Examiner* — William Choi
(74) *Attorney, Agent, or Firm* — Womble Bond Dickinson (US) LLP

(57) ABSTRACT

A tiled display device includes: a plurality of display devices; and a thermally variable member between the plurality of display devices. The thermally variable member includes a material whose light transmittance is different depending on a temperature.

20 Claims, 14 Drawing Sheets

TILED DISPLAY DEVICE

CROSS-REFERENCE TO RELATED APPLICATION

This application claims priority to and the benefit of Korean Patent Application No. 10-2020-0186995, filed on Dec. 30, 2020, in the Korean Intellectual Property Office, the content of which is herein incorporated by reference in its entirety.

BACKGROUND

1. Field

Aspects of embodiments of the present disclosure relate to a tiled display device.

2. Description of the Related Art

With the advance of an information-oriented society, there are increasing demands are placed on display devices to display images in various ways. For example, display devices are employed in various electronic devices, such as smartphones, digital cameras, laptop computers, navigation devices, and smart televisions. A display device may be a flat panel display device, such as a liquid crystal display device, a field emission display device, and an organic light emitting display device. From among the flat panel display devices, a light emitting display device does not require a backline unit providing light to the display panel to display an image because each pixels of the display panel includes a light emitting element capable of emitting light by itself (e.g., includes a self-emissive element).

When the display device is manufactured in a large size, a defect rate of the light emitting element may increase due to an increase in the number of pixels, thereby deteriorating productivity or reliability of the display device. One way to mitigate this issue is to provide a tiled display device, in which a large-sized screen may be implemented by connecting a plurality of display devices having a relatively small size. The tiled display device may include a boundary portion, called a seam, between the plurality of display devices due to a non-display area (or a bezel area) of each of the plurality of display devices adjacent to each other. When a single image is displayed on (or across) the entire screen, the boundary portion between the plurality of display devices may give a sense of disconnection over the entire screen, thereby reducing a sense of immersion in the image.

SUMMARY

Aspects of the present disclosure provide a tiled display device that eliminates or reduces a sense of disconnection between a plurality of display devices and improves a sense of immersion in an image by partially or entirely eliminating the visibility of a boundary portion between the plurality of display devices to a user in both an on state and an off state of the tiled display device.

However, aspects and features of the present disclosure are not limited to those set forth above and described herein. The above and other aspects and features of the present disclosure will be apparent to one of ordinary skill in the art to which the present disclosure pertains by referencing the detailed description of the present disclosure given below.

According to an embodiment of the present disclosure, a tiled display device includes: a plurality of display devices; and a thermally variable member between the plurality of display devices. The thermally variable member includes a material whose light transmittance is different depending on a temperature.

According to another embodiment of the present disclosure, a tiled display device includes: a first display device having a plurality of emission areas and a light blocking area extending around a periphery of the emission areas; a second display device spaced apart from the first display device and having a plurality of emission areas and a light blocking area extending around a periphery of the emission areas; and a thermally variable member on each side surface of the first display device and the second display device facing and being spaced apart from each other between the first display device and the second display device. The thermally variable member includes a material whose light transmittance is different depending on a temperature.

According to embodiments of the present disclosure, a tiled display device may include a thermally variable member in a boundary area between a plurality of display devices, and the thermally variable member includes a material whose optical characteristics are different (e.g., vary) depending on a temperature. The thermally variable member may reduce the difference between the reflectance of external light from each of the plurality of display devices and the reflectance of external light from the boundary area in the off state while allowing the light incident on the boundary area from among the light emitted from the plurality of display devices to be diffused and emitted to the outside of the tiled display device in the on state. Accordingly, the tiled display device according to embodiments of the present disclosure may eliminate or substantially mitigate a sense of disconnection between a plurality of display devices and improve a sense of immersion in an image by preventing the boundary portion between the plurality of display devices from being recognized by a user.

It should be noted that the aspects and features of the present disclosure are not limited to those described above, and other aspects and features of the present disclosure will be apparent from the following description.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
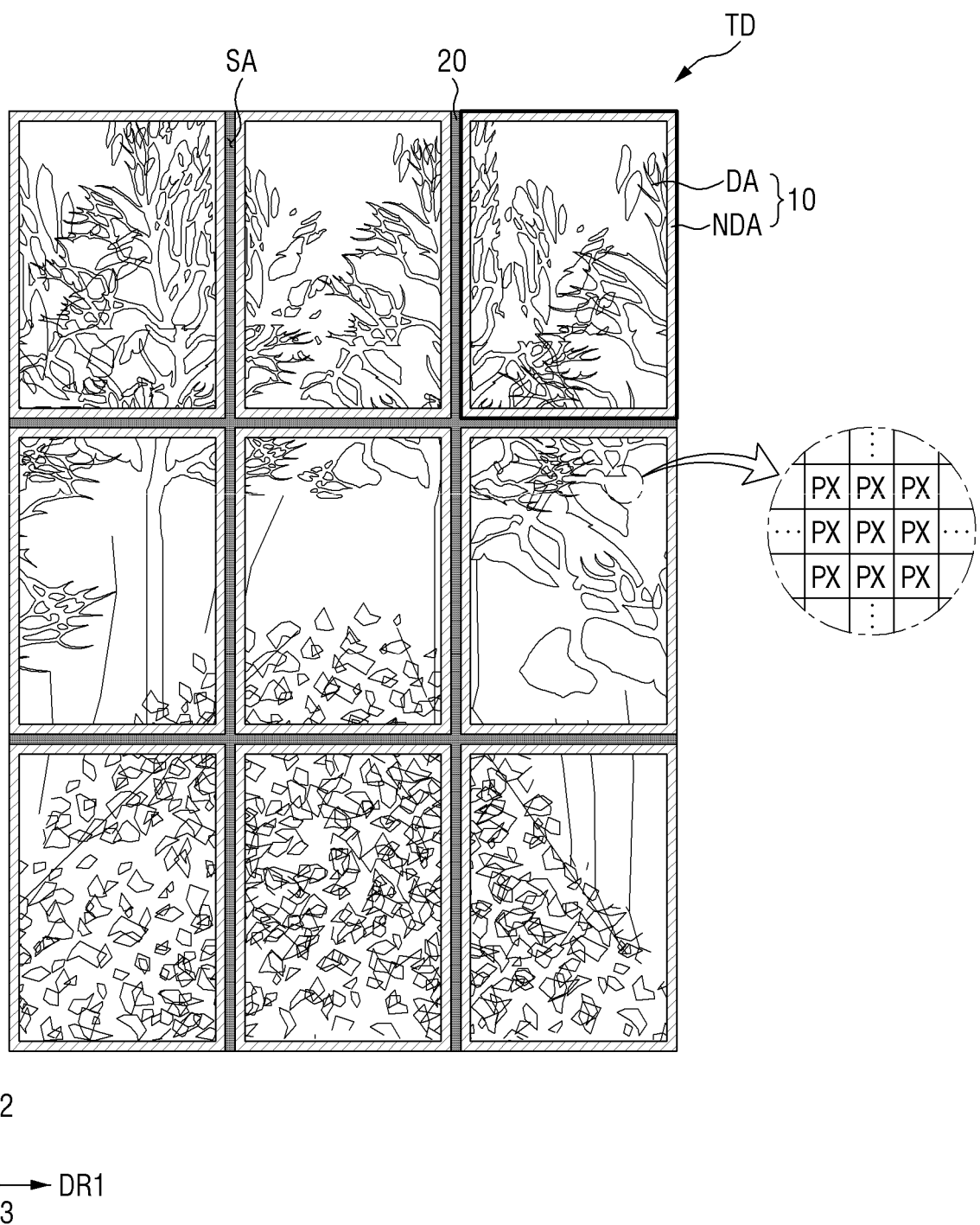
FIG. 1 is a schematic plan view of a tiled display device according to an embodiment.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present disclosure will be described with reference to the drawings.

Figure 2:
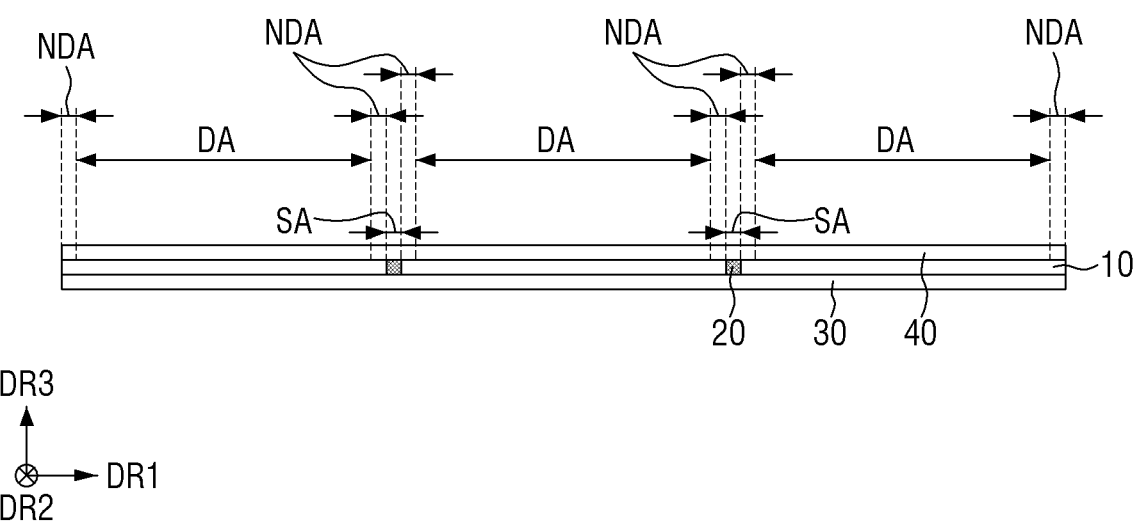
FIG. 2 is a schematic cross-sectional view of a tiled display device according to an embodiment.

FIG. 1 is a schematic plan view of a tiled display device according to an embodiment, and FIG. 2 is a schematic cross-sectional view of the tiled display device shown in FIG. 1.

Referring to FIGS. 1 and 2, a tiled display device TD displays a moving image or a still image. The tiled display device TD may refer to any electronic device providing (or including) a display screen. Examples of the tiled display device TD may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like, which provide a display screen.

Hereinafter, a first direction DR1, a second direction DR2, a third direction DR3 are defined in the drawings. The first direction DR1 and the second direction DR2 may be directions perpendicular to each other in one plane. The third direction DR3 may be a direction perpendicular to the plane on which the first direction DR1 and the second direction DR2 are located. In other words, the third direction DR3 is perpendicular to each of the first direction DR1 and the second direction DR2. Hereinafter, the third direction DR3 indicates a thickness direction (or a display direction) of the tiled display device TD according to embodiments of the present disclosure.

The tiled display device TD according to an embodiment includes a plurality of display devices 10 and a thermally variable member 20. The tiled display device TD may further include a lower plate 30 and a light control film 40.

The tiled display device TD may have a rectangular shape with short sides in the first direction DR1 and long sides in the second direction DR2 in a plan view. The tiled display device TD may have an overall planar shape but is not limited thereto. In some embodiments, the tiled display device TD may have a three-dimensional shape to provide a three-dimensional effect to a user. For example, when the tiled display device TD has a three-dimensional shape, at least some of the plurality of display devices 10, to be described later, may have a curved shape. In other embodiments, the plurality of display devices 10 may each have a planar shape and may be disposed to have an angle (e.g., a predetermined angle) with respect to each other so that the tiled display device TD may have a three-dimensional shape. Because the tiled display device TD includes the plurality of display devices 10, the display area at where an image is displayed may be increased.

The lower plate 30 may provide and support an area where the plurality of display devices 10 are disposed (e.g., the display devices 10 may be disposed or arranged on the lower plate 30). The planar shape of the lower plate 30 may follow (or correspond to) the planar shape of the tiled display device TD. In an embodiment in which the tiled display device TD has the above-described rectangular shape in a plan view, the lower plate 30 may have a rectangular shape also with short sides in the first direction DR1 and long sides in the second direction DR2 in a plan view. Various wirings and cables for electrically connecting the plurality of display devices 10 may be disposed at the lower plate 30, and a fastening member for fixing the plurality of display devices 10 and/or a moving member capable of moving each of the plurality of display devices 10 in the first direction DR1 and/or the second direction DR2 to align the plurality of display devices 10 on the lower plate 30 may be further disposed at the lower plate 30.

The plurality of display devices 10 may be disposed on the lower plate 30. The plurality of display devices 10 may be fixed on one surface of the lower plate 30 by the fastening member.

The plurality of display devices 10 may be arranged in a matrix shape on the lower plate 30. The plurality of display devices 10 may be spaced apart from each other at intervals (e.g., at regular or predetermined intervals) along the first direction DR1 and the second direction DR2 in a plan view. Because the plurality of display devices 10 are spaced apart from each other at intervals on the lower plate 30, the display devices 10 may not be damaged by adjacent display devices 10 even when the display devices 10 expand due to the heat generated therein (or therefrom). Although an embodiment in which the plurality of display devices 10 are arranged in a 3×3 matrix shape is illustrated, the number and the arrangement of the plurality of display devices 10 are not limited thereto.

Although the arrangement directions of the plurality of display devices 10 coincide with the first direction DR1 and the second direction DR2, which are the extension directions of the long sides and the short sides of the tiled display device TD, in the drawings, the present disclosure is not limited thereto, and the arrangement directions of the display devices 10 and the extension directions of the long sides/short sides of the tiled display device TD may be tilted at an inclination angle (e.g., at a predetermined inclination angle).

Each of the plurality of display devices 10 may have a rectangular shape with short sides in the first direction DR1 and long sides in the second direction DR2 in a plan view. However, the present disclosure is not limited thereto, and each of the plurality of display devices 10 may have a rectangular shape with long sides in the first direction DR1 and short sides in the second direction DR2. The plurality of display devices 10 may have the same planar shape. Further, the plurality of display devices 10 may have the same size. However, the present disclosure is not limited thereto, and the plurality of display devices 10 may have different planar shapes and may have different sizes.

The display devices 10 adjacent to each other may be spaced apart from each other such that the long sides and/or the short sides are opposed to each other. Some of the plurality of display devices 10 included in the tiled display device TD may be arranged at the edges of the tiled display device TD to be adjacent to one side of the tiled display device TD. Some other of the plurality of display devices 10 included in the tiled display device TD may be arranged near the corners of the tiled display device TD. Still other of the plurality of display devices 10 included in the tiled display device TD may be disposed inside the tiled display device TD and surrounded by (e.g., surrounded along their peripheries by) other ones of the plurality of display devices 10.

Each of the display devices 10 includes a display panel which provides a display screen. Examples of the display panel may include an inorganic light emitting diode display panel, an organic light emitting display panel, a quantum dot light emitting display panel, a plasma display panel, and a field emission display panel. In the following description, an inorganic light emitting diode display panel is described as an example, but the present disclosure is not limited thereto, and other display panels may be applied within the technical spirit of the present disclosure.

Each of the plurality of display devices 10 may have a display area DA and a non-display area NDA. The display area DA is an area where an image can be displayed, and the non-display area NDA is an area where an image is not displayed.

The shape of the display area DA may follow the shape of the display device 10. For example, the display area DA may have a rectangular shape similar to the overall shape of the display device 10 in a plan view. The display area DA may substantially occupy the center of the display device 10.

The display area DA may include a plurality of pixels PX. The plurality of pixels PX may be arranged in a matrix. Each pixel PX may have a rectangular or square shape in a plan view. In an embodiment, each pixel PX may include a plurality of light emitting elements including (or made of) inorganic particles but is not limited thereto.

The non-display area NDA may be disposed around (e.g., around a periphery of) the display area DA. The non-display area NDA may completely or partially surround (or extend around a periphery of) the display area DA.

The tiled display device TD may also have a boundary area (or separation area) SA between the adjacent display devices 10.

The boundary area SA may be the separation area between the adjacent display devices 10. The boundary area SA may also be referred to as a seam. The boundary area SA may be surrounded by the non-display areas NDA of the adjacent display devices 10 (e.g., the boundary areas SA may be between non-display areas NDA of the adjacent display devices 10). The boundary area SA between the non-display areas NDA of the adjacent display devices 10 may be too small to be recognized by a user. In addition, the reflectance of external light of the display areas DA of the plurality of display devices 10 may be substantially the same as that of the non-display areas NDA between the plurality of display devices 10. Accordingly, in the tiled display device TD, the boundary portions or the non-display areas NDA between the plurality of display devices 10 may not be recognized by a user, thereby removing (or preventing or mitigating) a sense of disconnection between the plurality of display devices 10 and improving a sense of immersion in an image.

The thermally variable member 20 may be disposed between the plurality of display devices 10. The thermally variable member 20 may be disposed in the boundary area SA. The thermally variable member 20 may be disposed between the plurality of display devices 10 on the lower plate 30 to cover at least a part of the side surfaces of the plurality of display devices 10.

The thermally variable member 20 may include (or may contain) a material whose light transmittance and/or color changes depending on a temperature. For example, the thermally variable member 20 may include (or may contain) a material whose light transmittance increases as the temperature increases and decreases as the temperature decreases. Because the thermally variable member 20 includes the material whose light transmittance and/or color changes depending on a temperature, the light transmittance of the thermally variable member 20 that is disposed on the side surface of the display device 10 may be adjusted based on a temperature of the display device 10, which changes depending on the on/off state of the display device 10.

The light control film 40 may be disposed on the plurality of display devices 10 and the thermally variable member 20. The light control film 40 may cover the plurality of display devices 10 and the thermally variable member 20. For example, the light control film 40 may be a low reflection film and may reduce the reflection of external light of the tiled display device TD. The light control film 40 may be, but is not necessarily, integrally formed to cover the plurality of display devices 10 and the thermally variable member 20.

Figure 3:
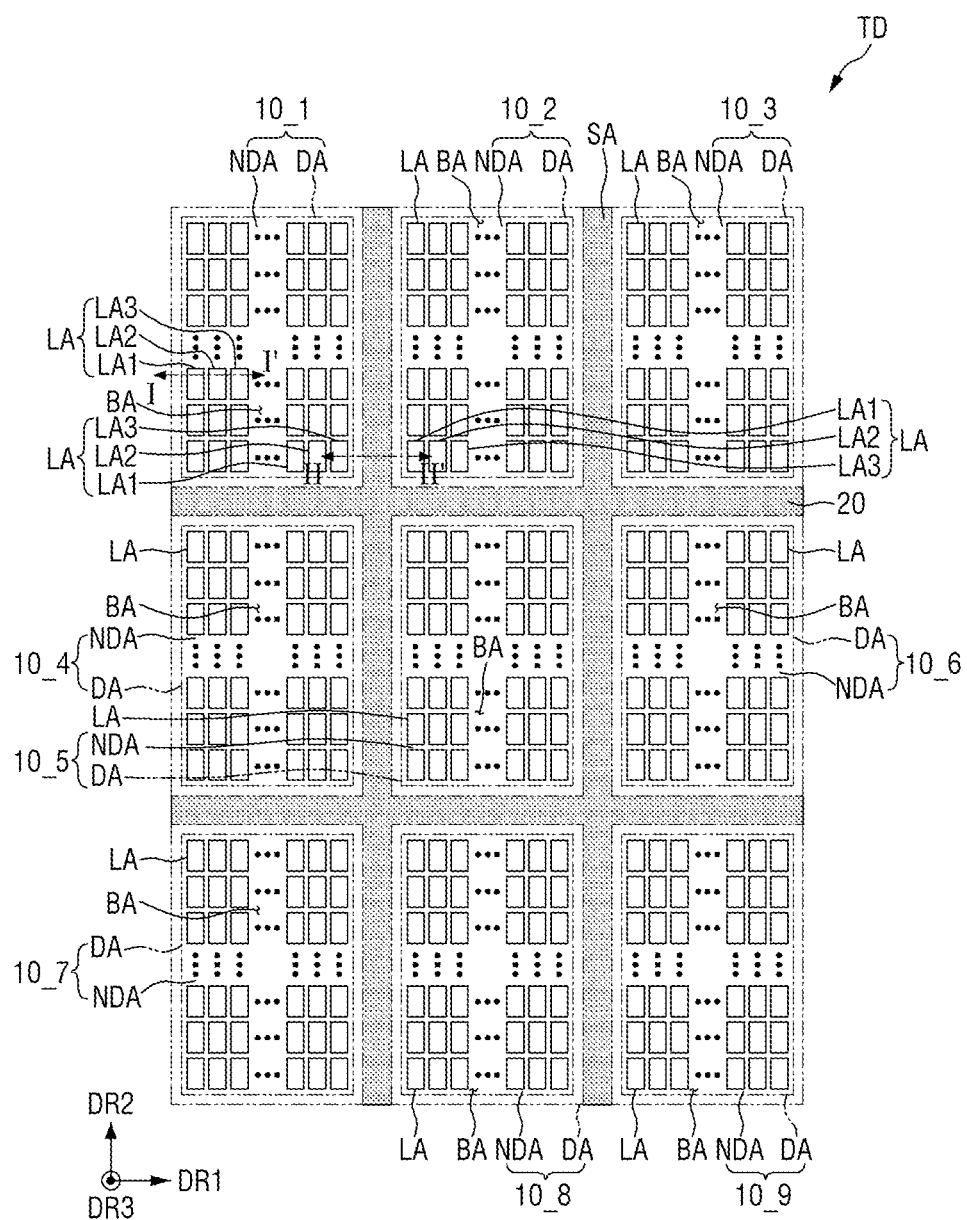
FIG. 3 is a plan view showing a display device according to an embodiment.

FIG. 3 is a plan view of the display device shown in FIGS. 1 and 2.

Referring to FIGS. 1 and 3, the tiled display device TD may include the plurality of display devices 10 (e.g., display devices 10_1, 10_2, 10_3, 10_4, 10_5, 10_6, 10_7, 10_8, and 10_9) spaced apart from each other at intervals (e.g., at regular or predetermined intervals) and the thermally variable member 20 disposed between the plurality of display devices 10. For example, the plurality of display devices 10 may include first to ninth display devices 10_1, 10_2, 10_3, 10_4, 10_5, 10_6, 10_7, 10_8, and 10_9. The first to ninth display devices 10_1, 10_2, 10_3, 10_4, 10_5, 10_6, 10_7, 10_8, and 10_9 may be spaced apart from each other in the first direction DR1 and/or the second direction DR2. the nine display devices 10 are illustrated as being arranged in a 3×3 matrix structure, the number and the arrangement of the display devices 10 are not limited to those shown in FIG. 3. The number of the display devices 10 may be determined according to the size of each of the display devices 10 and the tiled display device TD.

Some of the display devices 10_2, 10_4, 10_6, and 10_8 from among the plurality of display devices 10 included in the tiled display device TD may be arranged at the edges of the tiled display device TD to be adjacent to one side of the tiled display device TD. Some other of the display devices 10_1, 10_3, 10_7, and 10_9 from among the display devices 10 included in the tiled display device TD may be arranged near the corners of the tiled display device TD. Still another display device 10_2 from among the plurality of display devices 10 included in the tiled display device TD may be disposed inside the tiled display device TD and surrounded by (e.g., surrounded along its periphery by) other display devices 10.

As described above, the thermally variable member 20 may be disposed between the plurality of display devices 10 to cover the side surfaces of the plurality of display devices 10. Although not limited to the following, some of the display devices 10_2, 10_4, 10_6, and 10_8 arranged at the edges of the tiled display device TD from among the plurality of display devices 10 may be arranged such that the thermally variable member 20 covers first to third side surfaces except one side of the tiled display device TD. Further, some other of the display devices 10_1, 10_3, 10_7, and 10_9 arranged near the corners of the tiled display device TD from among the plurality of display devices 10 may be arranged such that the thermally variable member 20 covers the first and second side surfaces except the corners of the tiled display device TD. Further, the display device 10_5 disposed inside the tiled display device TD from among the plurality of display devices 10 may be disposed such that the thermally variable member 20 covers first to fourth side surfaces of the display devices 10_5.

The display area DA of each display device 10 includes a plurality of pixels PX arranged along a plurality of rows and columns. The pixel PX represents the smallest unit of repetition for display. In order to achieve a full-color display, each pixel PX may include a plurality of sub-pixels emitting different colors.

Each of the sub-pixels may have an emission area LA (e.g., emission areas LA1, LA2, and LA3) defined by a pixel defining layer and a light blocking area BA around the emission area LA.

The emission area LA may be an area where light emitted from a light emitting element layer of the display device 10, to be described later, is provided to (or emitted to) the outside, and the light blocking area BA may be an area where the light emitted from the light emitting element layer does not transmit.

The emission area LA may include a first emission area LA1, a second emission area LA2, and a third emission area LA3. The first to third emission areas LA1, LA2, and LA3 may be areas where light having a predetermined peak wavelength is emitted to the outside of the display device 10. The first emission area LA1 may emit light of a first color, the second emission area LA2 may emit light of a second color, and the third emission area LA3 may emit light of a third color. For example, the first color light may be red light having a peak wavelength in a range from about 610 nm to about 650 nm, the second color light may be green light having a peak wavelength in a range from about 510 nm to about 550 nm, and the third color light may be blue light having a peak wavelength in a range from about 440 nm to about 480 nm, but the present disclosure is not limited thereto.

The first to third emission areas LA1, LA2, and LA3 may be sequentially and repeatedly arranged along the first direction DR1 in the display area DA of the display device 10. The first to third emission areas LA1, LA2, and LA3 may have, but are not necessarily limited to having, a rectangular planar shape whose width (or length) in the second direction DR2 is greater than the width in the first direction DR1.

In an embodiment, the width of the first emission area LA1 in the first direction DR1, the width of the second emission area LA2 in the first direction DR1, and the width of the third emission area LA3 in the first direction DR1 may be substantially the same. However, the relationship between the widths of the first to third emission areas LA1, LA2, and LA3 in the first direction DR1 is not limited to the embodiment shown in FIG. 3. For example, the width of the first emission area LA1 in the first direction DR1, the width of the second emission area LA2 in the first direction DR1, and the width of the third emission area LA3 in the first direction DR1 may be different from each other.

The light blocking area BA may be disposed to surround (or extend around a periphery of) the plurality of emission areas LA (LA1, LA2, and LA3). The adjacent emission areas LA may be distinguished by the light blocking area BA. The light blocking area BA may prevent or substantially prevent color mixture of light emitted from the first to third emission areas LA1, LA2, and LA3.

Figure 4:
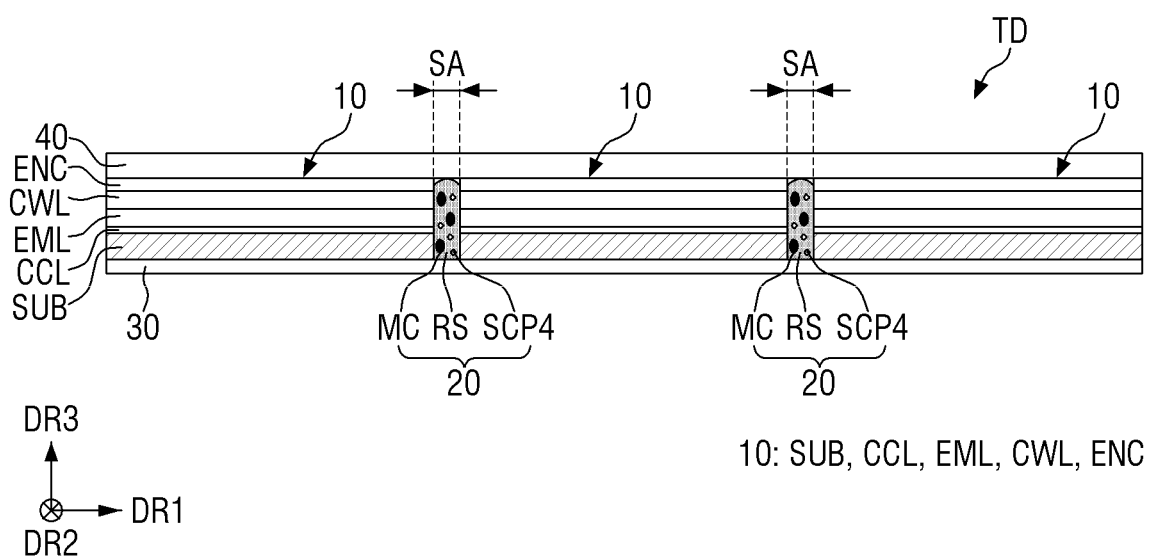
FIG. 4 is a schematic cross-sectional view of a tiled display device according to an embodiment.

FIG. 4 is a schematic cross-sectional view of a tiled display device according to an embodiment.

Referring to FIG. 4, the display device 10 may include a substrate SUB, a circuit layer CCL, a light emitting element layer EML, a color control layer CWL, and an encapsulation layer ENC.

The substrate SUB may be disposed on the lower plate 30. The substrate SUB may be a base substrate or a base member and may include (or may be made of) an insulating material, such as a polymer resin. For example, the substrate SUB may be a rigid substrate. When the substrate SUB is a rigid substrate, the substrate SUB may include a glass material or a metal material but is not limited thereto. In another example, the substrate SUB may be a flexible substrate which can be bent, folded, and rolled. When the substrate SUB is a flexible substrate, the substrate SUB may include polyimide (PI) but is not limited thereto.

The circuit layer CCL may be disposed on the substrate SUB. The circuit layer CCL may be disposed on one surface of the substrate SUB to drive a plurality of pixels PX. The circuit layer CCL may include one or more transistors and the like to drive the light emitting element layer EML.

The light emitting element layer EML may be disposed on one surface of the circuit layer CCL. The light emitting element layer EML may include pixels including a first electrode, a light emitting layer, and a second electrode. The light emitting layer may include an inorganic light emitting diode. A detailed description of the light emitting element layer EML will be given later.

The color control layer CWL may be disposed on the light emitting element layer EML. The color control layer CWL may transmit light emitted from the light emitting element layer EML and incident on the color control layer CWL while converting or maintaining the wavelength of the incident light.

The encapsulation layer ENC may be disposed on the color control layer CWL. The encapsulation layer ENC may prevent or substantially prevent oxygen or moisture from permeating the color control layer CWL and the light emitting element layer EML disposed therebelow. Therefore, the encapsulation layer ENC may include one or more inorganic films. The encapsulation layer ENC may be disposed to cover the color control layer CWL, the light emitting element layer EML, and the circuit layer CCL disposed therebelow.

The thermally variable member 20 may be disposed between the adjacent display devices 10. The thermally variable member 20 may be disposed in the boundary area SA between the adjacent display devices 10 and may control the optical characteristics of the boundary area SA such that the boundary area SA is not recognized by a user.

The thermally variable member 20 may control the optical characteristics of the boundary area SA to be different depending on the on/off state of the display device 10. For example, the optical characteristics of the boundary area SA may include the reflectance of external light and/or the light transmittance of the boundary area SA. In other words, the thermally variable member 20 may control the reflectance of external light and/or the light transmittance of the boundary area SA depending on the on/off state of the display device 10.

The temperature of the display device 10 may be different depending on the on/off state of the display device 10. For example, when the display device 10 is in the on state (e.g., is being driven), the temperature of the display device 10 may increase by the heat generated by, for example, the light emitting element layer EML. Further, when the display device 10 is in the off state, the temperature of the display device 10 may decrease because no heat is being generated in the light emitting element layer EML. Therefore, because the thermally variable member 20 includes the material whose optical characteristics are different (e.g., vary) depending on a temperature, the thermally variable member 20 may indirectly control the optical characteristics of the boundary area SA to be different depending on the on/off state of the display device 10.

The thermally variable member 20 may include (or may contain) a resin RS and a thermochromic material MC dispersed in the resin RS. The thermally variable member 20 may further include (or may further contain) a light diffuser SCP4 dispersed in the resin RS.

The resin RS may include a material having a relatively high light transmittance. The resin RS may include (or may be made of) a transparent material. For example, the resin RS may include a silicon-based inorganic material or an organic material, such as an epoxy resin, an acrylic resin, a cardo resin, or an imide resin.

The light diffuser SCP4 may be dispersed in the resin RS. The light diffuser SCP4 may scatter the incident light in random directions regardless of the incident direction of the incident light without substantially converting the peak wavelength of the incident light. For example, the light diffuser SCP4 may scatter the light emitted from the display device 10 in the on state of the display device 10 and incident on the boundary area SA in random directions to prevent or substantially prevent the boundary area SA from being recognized by a user.

The light diffuser SCP4 may have a refractive index different from that of the resin RS. The light diffuser SCP4 and the resin RS may form an optical interface. For example, the light diffuser SCP4 may include (or may contain) a light scattering material or light scattering particles that scatter at least some of the light incident on the thermally variable member 20.

The light diffuser SCP4 may include (or may contain) metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), silicon oxide ($SiO_2$), and the like. Examples of a material of the organic particles may include an acrylic resin, a urethane resin, and the like.

The thermochromic material MC may be dispersed in the resin RS. The thermochromic material MC may include a material whose optical characteristics are changed depending on a temperature. The thermochromic material MC may include a material whose color and/or transparency is changed depending on a temperature, or may include a material whose alignment degree is changed depending on a temperature and whose transparency is changed depending on the alignment degree of the thermochromic material. The thermochromic material MC may be a pigment whose color is changed by physical and/or chemical changes, such as polymorphic transition due to a constant temperature, changes in pH, release of crystal water, thermal decomposition reaction, solid phase reaction, or the like. For example, the thermochromic material MC may be a material that exhibits a dark color, such as black or the like, when the temperature of the thermally variable member 20 is lower than or equal to a first reference temperature, and the thermochromic material MC may become transparent when the temperature of the thermally variable member 20 exceeds the first reference temperature due to heat applied to the thermally variable member 20. For example, the thermochromic material MC may exhibit black at the temperature lower than or equal to the first reference temperature, for example, a specific critical temperature, and may become transparent to prevent or substantially prevent the boundary area SA from being recognized at the temperature higher than the first reference temperature.

The first reference temperature may be determined in consideration of the temperature of the display device 10 in the on state. For example, the first reference temperature may be determined to be about 50° C. when the temperature of the display device 10 is lower than or equal to about 50° C. in the off state, in which no light is emitted from the light emitting element EML of the display device 10, and when the temperature of the display device 10 exceeds about 50° C. in the on state, in which light is emitted from the light emitting element layer EML. Although not limited to the following, the first reference temperature may be within a range of about 45° C. to about 60° C. depending on the temperature of the display device 10 in the on state.

The temperature of the thermally variable member 20 disposed on the side surface of the display device 10 in the boundary area SA may be substantially the same as the temperature of the display device 10. The heat generated from the display device 10 may be transferred to the thermally variable member 20 disposed to cover the side surface of the display device 10. Therefore, when the temperature of the display device 10 is increased depending on the on/off state of the display device 10, the heat generated from the display device 10 may be transferred to the thermally variable member 20, and the temperature of the thermally variable member 20 may be increased. When the temperature of the display device 10 is decreased depending on the on/off state of the display device 10, the temperature of the thermally variable member 20 may be decreased.

Accordingly, when the display device 10 is in the off state, the temperature of the thermally variable member 20 may be lower than or equal to the first reference temperature, and when the display device 10 is in the on state, the temperature of the thermally variable member 20 may exceed the first reference temperature. Because the first reference temperature, which is the critical temperature of the thermochromic material MC, is determined depending on the temperature of the display device 10 in the on state, when the display device 10 is in the off state, the temperature of the thermally variable member 20 may be lower than or equal to the first reference temperature, and the thermochromic material MC disposed in the boundary area SA may exhibit black. Therefore, when the display device 10 is in the off state, the thermochromic material MC disposed in the boundary area SA exhibits black so that the reflectance of external light of the display device 10 in the off state and the reflectance of external light of the boundary area SA in the off state may be substantially the same. Further, because the first reference temperature is determined depending on the temperature of the display device 10 in the on state, when the display device 10 is in the on state, the temperature of the thermally variable member 20 may exceed the first reference temperature, and the thermochromic material MC disposed in the boundary area SA may be transparent. Therefore, when the display device 10 is in the on state, the thermochromic material MC disposed in the boundary area SA is transparent so that the light emitted from the display device 10 in the on state and incident on the thermally variable member 20 may transmit the thermally variable member 20.

The changes in color and/or transparency depending on the temperature of the thermochromic material MC may be reversible. For example, the thermochromic material MC may exhibit black when the temperature of the thermally variable member 20 is lower than or equal to the first reference temperature, may become transparent when the temperature of the thermally variable member 20 exceeds the first reference temperature, and may exhibit black when the temperature of the thermally variable member 20 becomes lower than or equal to the first reference temperature again. The thermochromic material MC has reversibility and, thus, may be used to prevent or substantially prevent the boundary area SA from being recognized by a user even when the on state and the off state of the plurality of display devices 10 are repeated.

Figure 5:
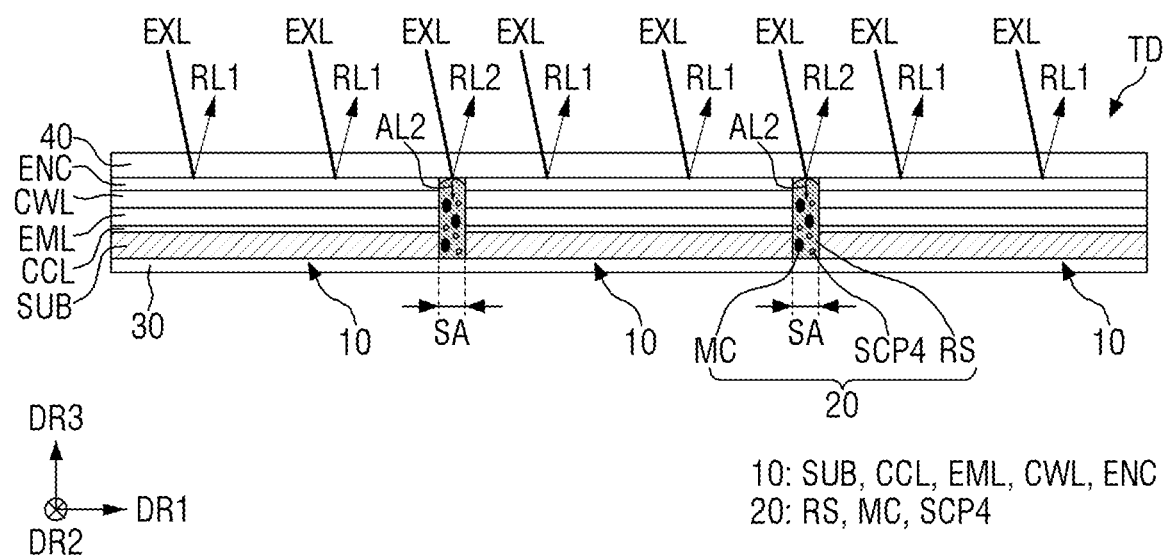
FIG. 5 is a schematic cross-sectional view showing an off state of a tiled display device according to an embodiment.
Figure 6:
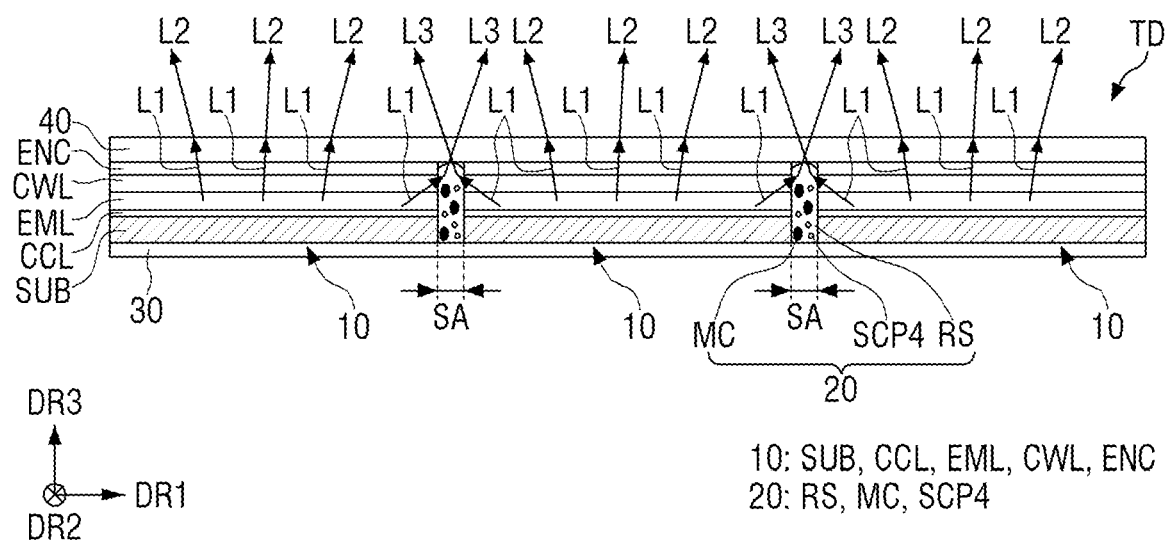
FIG. 6 is a schematic cross-sectional view showing an on state of a tiled display device according to an embodiment.

FIG. 5 is a schematic cross-sectional view showing an off state of a tiled display device according to an embodiment, and FIG. 6 is a schematic cross-sectional view showing an on state of a tiled display device according to an embodiment.

FIG. 5 is a schematic cross-sectional view showing the traveling direction of external light EXL incident on the tiled display device TD from the outside of the tiled display device TD in the off state of the plurality of display devices 10.

As described above, when the plurality of display devices 10 are in the off state, the temperature of the display device 10 may be lower than or equal to the first reference temperature. Therefore, the temperature of the thermally variable member 20 disposed to cover the side surfaces of the plurality of display devices 10 may be lower than or equal to the first reference temperature, which is substantially the same as the temperature of the display devices 10. Therefore, the thermochromic material MC in the thermally variable member 20 may exhibit black.

When the plurality of display devices 10 are in the off state, partial light RL1 (hereinafter, referred to as "first reflected light") of the external light EXL incident on the plurality of display devices 10 from the outside of the tiled display device TD may be reflected to the outside of the tiled display device TD, and other partial light (e.g., the remaining external light EXL incident on the plurality of display devices 10) may be absorbed into the display device 10. For example, the ratio of the first reflected light RL1 to the external light EXL incident on the plurality of display devices 10 from the outside of the tiled display device TD in the off state may be 1% or less. Hereinafter, the ratio of the reflected light to the external light EXL incident on the plurality of display devices 10 from the outside of the tiled display device TD in the off state will be referred to as "reflectance of external light."

When the plurality of display devices 10 are in the off state, partial light RL2 (hereinafter, referred to as "second reflected light") of the external light EXL incident on the thermally variable member 20 disposed in the boundary area SA from the outside of the tiled display device TD may be reflected to the outside of the tiled display device TD, and other partial light AL2 (e.g., the remaining external light EXL incident on the thermally variable member 20) may be adsorbed into the thermally variable member 20. For example, the ratio of the second reflected light RL2 reflected to the outside of the tiled display device TD to the external light EXL incident on the thermally variable member 20 from the outside of the tiled display device TD in the off state (e.g., the reflectance of external light of the thermally variable member 20) may be about 5% or less.

Because the thermally variable member 20 is disposed in the boundary area SA between the plurality of display devices 10, when the plurality of display devices 10 are in the off state, the thermochromic material MC in the thermally variable member 20 disposed in the boundary area SA may exhibit black. Therefore, the reflectance of external light of the display device 10 in the off state and the reflectance of external light of the thermally variable member 20 may be substantially the same. Although not limited to the following, the difference between the reflectance of external light of the display device 10 in the off state and the reflectance of external light of the thermally variable member 20 may be about 4% or less. Because the difference between the reflectance of external light of the display device 10 in the off state and the reflectance of external light of the thermally variable member 20 is about 4% or less, the difference in the reflectance of external light between the plurality of display devices 10 and the thermally variable member 20 may be at a level at which the boundary area SA between the plurality of display devices 10 is not recognized by a user. Therefore, it is possible to prevent or substantially prevent the boundary area SA between the plurality of display devices 10 of the tiled display device TD from being recognized by a user in the off state.

FIG. 6 is a schematic cross-sectional view showing the traveling direction of first light L1 emitted from the light emitting element layer EML of the plurality of display devices 10 when the plurality of display devices 10 of the tiled display device TD are in the on state.

Referring to FIG. 6, when the plurality of display devices 10 are in the on state, the first light L1 may be emitted from the light emitting element layer EML. In the on state in which the first light L1 is emitted from the light emitting element layer EML, heat may be generated from the inside of the display device 10. Therefore, the temperature of the display device 10 in the on state may exceed the first reference temperature. Therefore, the temperature of the thermally variable member 20 disposed to cover the side surfaces of the plurality of display devices 10, which is substantially the same as the temperature of the display device 10, may exceed the first reference temperature. Therefore, the thermochromic material MC in the thermally variable member 20 may become transparent in the on state in which the first light L1 is emitted from the light emitting element layer EML. When the temperature of the thermally variable member 20 exceeds the first reference temperature, the light transmittance of the thermally variable member 20 may be about 80% or higher.

When the plurality of display devices 10 are in the on state, the light emitting element layers EML of the display devices 10 may emit the first light L1. Partial light L2 (hereinafter referred to as "second light") of the first light L1 emitted from the light emitting element layer EML of the display device 10 may be emitted to the outside of the display device 10, and other partial light L3 (hereinafter referred to as "third light") of the first light L1 may travel to the boundary area SA between the display devices 10.

The third light L3 that has traveled to the boundary area SA between the display devices 10 may be incident on the thermally variable member 20 disposed in the boundary area SA. When the plurality of display devices 10 are in the on state, the thermochromic material MC in the thermally variable member 20 becomes transparent as described above, and the resin RS in which the thermochromic material MC is dispersed becomes (or is) transparent. Therefore, the third light L3 may be emitted to the outside of the tiled display device TD while transmitting the thermally variable member 20. Further, the third light L3 may be diffused by the light diffuser SCP4 in the thermally variable member 20. Therefore, a phenomenon that an image is disconnected at the boundary area SA between the plurality of display devices 10 of the tiled display device TD in the on state may be prevented and the boundary area SA may not be recognized by a user.

Referring to FIGS. 5 and 6, the optical characteristics of the boundary area SA may be controlled (or varied) depending on the on/off state of the display device 10 by the thermally variable member 20 disposed in the boundary area SA, that is, the separation area between the display devices 10. For example, when the display device 10 is in the on state (i.e., when the first light L1 is emitted from the light emitting element layer EML), the temperature of the thermally variable member 20 disposed in the boundary area SA is increased. Therefore, the thermochromic material MC may become transparent, and the light transmittance of the thermally variable member 20 may be increased. Accordingly, the third light L3 that has travelled toward the boundary area SA from among the light emitted from the display device 10 may be incident on the transparent thermally variable member 20 and may then emitted to the outside of the tiled display device TD. Therefore, the phenomenon that an image is disconnected at the boundary area SA between the plurality of display devices 10 of the tiled display device TD in the on state may be avoided and the boundary area SA may not be recognized by a user. Further, when the display device 10 is in the off state, the temperature of the thermally variable member 20 disposed in the boundary area SA is decreased and, thus, the thermochromic material MC may exhibit black. Because the thermochromic material MC exhibits black in the off state, the reflectance of external light of the display device 10 and the reflectance of external light of the boundary area SA (e.g., the reflectance of external light of the thermally variable member 20) may be substantially the same. Therefore, the boundary area SA between the plurality of display devices 10 of the tiled display device TD may not be recognized by a user in the off state.

Because the tiled display device TD according to the present embodiment includes the thermally variable member 20, whose light transmittance and/or color is changed depending on the temperature of the boundary area SA between the plurality of display devices 10, the optical characteristics of the boundary area SA may be controlled (or varied) depending on the on/off state of the display device 10. For example, in the on state, the thermally variable member 20 becomes transparent so that the light incident on the boundary area SA is diffused and emitted to the outside of the tiled display device TD while transmitting the thermally variable member 20 to prevent or substantially prevent an image from being disconnected by the boundary area SA. In the off state, the thermally variable member 20 exhibits black to reduce the difference between the reflectance of external light of the boundary area SA and the reflectance of external light of the display device 10 so that the boundary area SA of the tiled display device TD may not be recognized by a user in both the on state and the off state of the display device 10.

Figure 7:
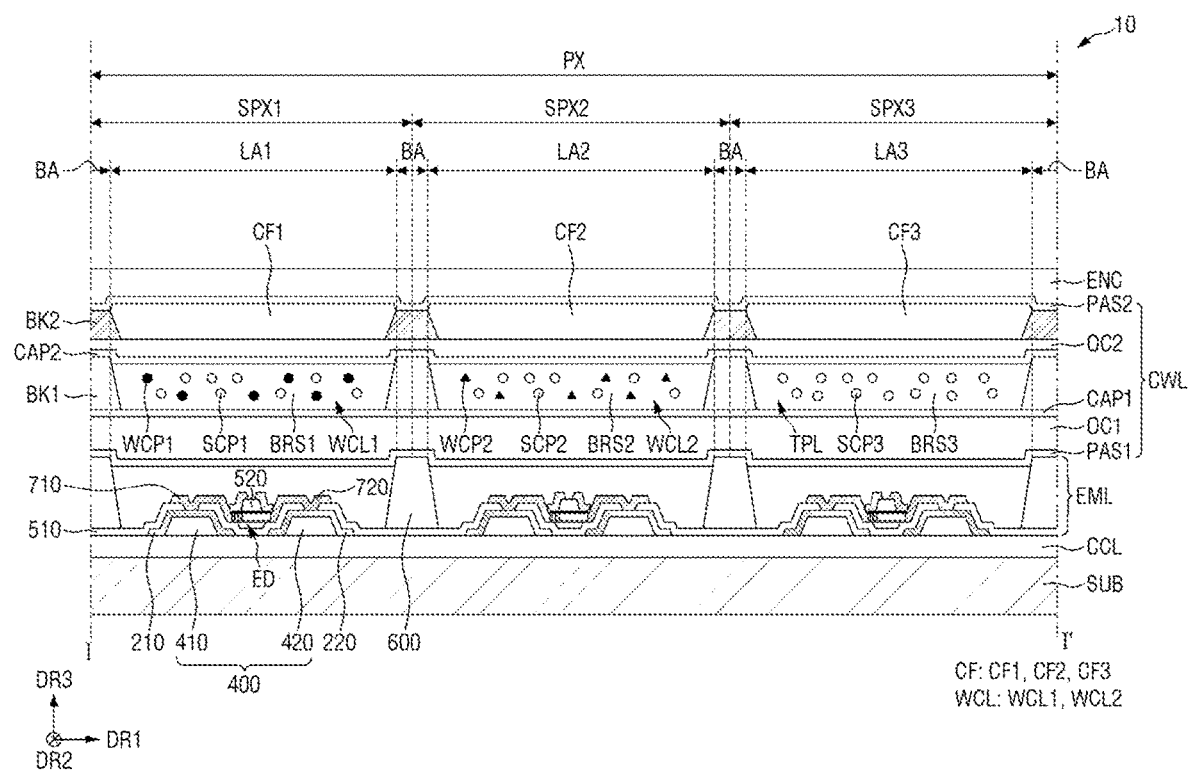
FIG. 7 is a cross-sectional view of a display device taken along the line I-I' of FIG. 3.

FIG. 7 is a cross-sectional view illustrating a display device taken along the line I-I' of FIG. 3.

Referring to FIG. 7, the display device 10 may include the substrate SUB, the circuit layer CCL disposed on the substrate SUB, the light emitting element layer EML disposed on the circuit layer CCL, the color control layer CWL, and the encapsulation layer ENC disposed on the light emitting element layer EML.

The substrate SUB may be an insulating substrate. The substrate SUB may include (or may be made of) an insulating material, such as glass, quartz, or polymer resin. Further, the substrate SUB may be a rigid substrate but may also be a flexible substrate which can be bent, folded or rolled.

The circuit layer CCL for driving the pixel PX (or sub-pixel SPX) may be disposed on one surface of the substrate SUB. The circuit layer CCL may include at least one transistor and the like to drive the light emitting element layer EML.

The light emitting element layer EML may be disposed on one surface of the circuit layer CCL. The light emitting element layer EML may include a first bank 400, a second bank 600, a first electrode 210, a second electrode 220, a first contact electrode 710, a second contact electrode 720, a light emitting element ED, and a plurality of insulating layers 510, 520, and 530.

The first bank 400 may be disposed on the circuit layer CCL. The first bank 400 may be disposed in each of the first to third emission areas LA1, LA2, and LA3 of first to third sub-pixels SPX1, SPX2, and SPX3. A plurality of first banks 400 may be disposed in the first to third emission areas LA1, LA2, and LA3 while being spaced apart from each other along the first direction DR1. In an embodiment, the first bank 400 disposed in the emission area LA of each sub-pixel SPX may include a first sub-bank 410 and a second sub-bank 420.

The first electrode 210 may be disposed on the first sub-bank 410 to cover the first sub-bank 410. The second electrode 220 may be disposed on the second sub-bank 420 to cover the second sub-bank 420. The first electrode 210 and the second electrode 220 may be electrically insulated from each other.

The first insulating layer 510 is disposed on the first electrode 210 and the second electrode 220 and exposes at least a part of the first electrode 210 and the second electrode 220. The first insulating layer 510 may protect the first electrode 210 and the second electrode 220 and insulate them from each other. Further, the light emitting element ED disposed on the first insulating layer 510 may not be damaged by direct contact with other members.

The second bank 600 may be disposed on the first insulating layer 510 and may have an opening exposing the first bank 400 and the plurality of light emitting elements ED, to be described later. The second bank 600 may be disposed at the boundary of the sub-pixels SPX to distinguish the adjacent sub-pixels SPX. The second bank 600 may be disposed over (or at) the boundary of the adjacent sub-pixels SPX. The second bank 600 may prevent or substantially prevent ink, in which the plurality of light emitting elements ED are dispersed, from overflowing to the adjacent sub-pixels SPX during an inkjet printing process using the ink.

The light emitting element ED may be disposed on the first insulating layer 510 between the first sub-bank 410 and the second sub-bank 420. The light emitting element ED may be disposed on the first insulating layer 510 between the first electrode 210 and the second electrode 220 such that both ends thereof are located on the first electrode 210 and the second electrode 220, respectively.

The light emitting elements ED may include active layers including (or containing) the same material to emit light in the same wavelength band (e.g., light of the same color). Light emitted from each of the first to third emission areas LA1, LA2, and LA3 may have the same color. For example, the plurality of light emitting elements ED may emit light of a third color (e.g., blue light) having a peak wavelength in a range of about 440 nm to about 480 nm. Therefore, the light emitting element layer EML may emit the third color light (e.g., blue light).

The second insulating layer 520 may be partially disposed on the light emitting element ED disposed between the first sub-bank 410 and the second sub-bank 420. The second insulating layer 520 may be disposed to partially surround the outer surface of the light emitting element ED. The second insulating layer 520 may be disposed on the light emitting element ED to expose both ends (e.g., opposite ends) of the light emitting element ED. The second insulating layer 520 may protect the light emitting element ED and may also fix the light emitting element ED in a manufacturing process of the display device 10.

The first contact electrode 710 may be disposed on the first electrode 210, and the second contact electrode 720 may be disposed on the second electrode 220. The first contact electrode 710 and the second contact electrode 720 may be electrically insulated from each other.

The first contact electrode 710 and the second contact electrode 720 may contact the light emitting element ED and the plurality of electrodes 210 and 220, respectively. For example, the first contact electrode 710 may contact a part of the first electrode 210 exposed by the first insulating layer 510 and one end of the light emitting element ED exposed by the second insulating layer 520. The second contact electrode 720 may contact a part of the second electrode 220 exposed by the first insulating layer 510 and the other end of the light emitting element ED exposed by the second insulating layer 520.

One end of the light emitting element ED exposed by the second insulating layer 520 may be electrically connected to the first electrode 210 through the first contact electrode 710, and the other end of the light emitting element ED may be electrically connected to the second electrode 220 through the second contact electrode 720.

The color control layer CWL may include a wavelength conversion layer WCL, a light transmitting pattern TPL, and a color filter layer CF. The color control layer CWL may further include a first passivation layer PAS1, a first planarization layer OC1, a first capping layer CAP1, a first light blocking member BK1, a second capping layer CAP2, a second planarization layer OC2, a second light blocking member BK2, and a second passivation layer PAS2.

The first passivation layer PAS1 may be disposed on the light emitting element layer EML. The first passivation layer PAS1 may protect the light emitting element layer EML. The first passivation layer PAS1 may prevent or substantially prevent infiltration of impurities, such as moisture or air, from the outside, thereby preventing or minimizing damage to the light emitting elements ED.

The first planarization layer OC1 may be disposed on the first passivation layer PAS1. The first planarization layer OC1 may flatten the stepped portion formed at the upper portion of the light emitting element layer EML. The first planarization layer OC1 may include an organic material. For example, the first planarization layer OC1 may include at least one of an acrylic resin, an epoxy resin, a phenol resin, a polyamide resin, or a polyimide resin.

The first capping layer CAP1 may be disposed on the first planarization layer OC1. The first capping layer CAP1 may encapsulate the bottom surfaces of the wavelength conversion layer WCL and the light transmitting pattern TPL. The first capping layer CAP1 may include (or may contain) an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The first light blocking member BK1 may be disposed on the first capping layer CAP1. The first light blocking member BK1 may be disposed in the light blocking area BA. The first light blocking member BK1 may overlap the second bank 600 in the thickness direction (e.g., the third direction DR3) of the display device 10. The first light blocking member BK1 may block or substantially block transmission of light. The first light blocking member BK1 may prevent or substantially prevent light infiltration and color mixture between the first to third emission areas LA1, LA2, and LA3, which improves color reproducibility. The first light blocking member BK1 may be formed in a grid shape surrounding (or extending around a periphery of) the first to third emission areas LA1, LA2, and LA3 in a plan view.

The first light blocking member BK1 may include an organic light blocking material and a lyophobic component. Here, the lyophobic component may be (or may formed of) a fluorine-containing monomer or a fluorine-containing polymer and, in more detail, may include fluorine-containing aliphatic polycarbonate. For example, the first light blocking member BK1 may include (or may be made of) a black organic material including the lyophobic component. The first light blocking member BK1 may be formed through a coating and exposure process of an organic light blocking material including the lyophobic component.

The wavelength conversion layer WCL and the light transmitting pattern TPL may be disposed on the first capping layer CAP1 exposed by the first light blocking member BK1. The wavelength conversion layer WCL may convert the wavelength of the incident light, and the light transmitting pattern TPL may transmit the incident light while maintaining the wavelength of the incident light.

The wavelength conversion layer WCL or the light transmitting pattern TPL may be disposed separately for each sub-pixel SPX. The wavelength conversion layer WCL or the light transmitting pattern TPL may be disposed in the emission area LA, and the adjacent wavelength conversion layers WCL and/or the adjacent light transmitting patterns TPL may be spaced apart from each other by the first light blocking member BK1 disposed in the light blocking area BA.

The wavelength conversion layer WCL and the light transmitting pattern TPL may be disposed on the first capping layer CPL1. In some embodiments, the wavelength conversion layer WCL and the light transmitting pattern TPL may be formed by an inkjet method. However, the present disclosure is not limited thereto, and the wavelength conversion layer WCL and the light transmitting pattern TPL may be formed by coating a photosensitive material, and then performing exposure, development, and patterning. In the following description, an embodiment in which the wavelength conversion layer WCL and the light transmitting pattern TPL are formed by the inkjet method will be described as an example.

The wavelength conversion layer WCL may be disposed in the sub-pixel SPX in which the wavelength of light incident from the light emitting element layer EML is to be converted because of the difference from the color of the corresponding sub-pixel SPX. The light transmitting pattern TPL may be disposed in the sub-pixel SPX in which the wavelength of the light incident from the light emitting element layer EML is the same as the color of the corresponding sub-pixel SPX. In the illustrated embodiment, the wavelength conversion layer WCL is disposed in the first sub-pixel SPX1 and the second sub-pixel SPX2 and the light transmitting pattern TPL is disposed in the third sub-pixel SPX3 where the light of the third color (e.g., where third color light) is incident from the light emitting element layer EML of each sub-pixel SPX.

In an embodiment, the wavelength conversion layer WCL may include a first wavelength conversion pattern WCL1 disposed in the first sub-pixel SPX_1 and a second wavelength conversion pattern WCL2 disposed in the second sub-pixel SPX_2.

The first wavelength conversion pattern WCL1 may be disposed in the first emission area LA1 partitioned by the first light blocking member BK1 in the first sub-pixel SPX1. The first wavelength conversion pattern WCL1 may convert the light having the wavelength of the third color incident from (or emitted by) the light emitting element layer EML into the light having the wavelength of the first color different from the third color and emit the light of the first color. For example, the first wavelength conversion pattern WCL1 may convert blue light incident from the light emitting element layer EML into red light and emit the red light.

The first wavelength conversion pattern WCL1 may include (or contain) a first base resin BRS1 and a first wavelength conversion material WCP1 dispersed in the first base resin BRS1. The first wavelength conversion pattern WCL1 may further include (or may further contain) first scatterers SCP1 dispersed in the first base resin BRS1.

The second wavelength conversion pattern WCL2 may be disposed in the second emission area LA2 partitioned by the first light blocking member BK1 in the second sub-pixel SPX2. The second wavelength conversion pattern WCL2 may convert the light having the wavelength of the third color incident from the light emitting element layer EML into the light having the wavelength of the second color different from the third color and emit the light of the second color. For example, the second wavelength conversion pattern WCL2 may convert blue light incident from the light emitting element layer EML into green light and emit the green light.

The second wavelength conversion pattern WCL2 may include (or contain) a second base resin BRS2 and a second wavelength conversion material WCP2 dispersed in the second base resin BRS2. The second wavelength conversion pattern WCL2 may further include (or may further contain) second scatterers SCP2 dispersed in the second base resin BRS2.

The light transmitting pattern TPL may be disposed in the third emission area LA3 partitioned by the first light blocking member BK1 in the third sub-pixel SPX3. The light transmitting pattern TPL may emit the light of the third color incident from the light emitting element layer EML while maintaining the wavelength thereof. For example, the light transmitting pattern TPL transmits the blue light incident from the light emitting element layer EML while maintaining the wavelength thereof.

The light transmitting pattern TPL may include (or contain) a third base resin BRS3. The light transmitting pattern TPL may further include (or may further contain) third scatterers SCP3 dispersed in the third base resin BRS3.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like. The first to third base resins BRS1, BRS2, and BRS3 may be formed of the same material, but the present disclosure is not limited thereto.

The first to third scatterers SCP1, SCP2, and SCP3 may have different refractive indices from those of the first to third base resins BRS1, BRS2, and BRS3. The first to third scatterers SCP1, SCP2, and SCP3 may include (or contain) metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin, urethane resin, and the like. The first to third scatterers SCP1, SCP2, and SCP3 may be, but are not necessarily, made of the same material.

The first wavelength conversion material WCP1 may convert the third color into the first color, and the second wavelength conversion material WCP2 may convert the third color into the second color. For example, the first wavelength conversion material WCP1 may convert blue light into red light, and the second wavelength conversion material WCP2 may convert blue light into green light. The first wavelength conversion material WCP1 and the second wavelength conversion material WCP2 may be quantum dots, quantum bars, phosphors, or the like. Examples of the quantum dot may include group IV nanocrystal, group II-VI compound nanocrystal, group III-V compound nanocrystal, group IV-VI nanocrystal, and a combination thereof.

The second capping layer CAP2 may be disposed on the wavelength conversion layer WCL, the light transmitting pattern TPL, and the first light blocking member BK1 to cover them. For example, the second capping layer CAP2 may encapsulate the first wavelength conversion pattern WCL1, the second wavelength conversion pattern WCL2, the light transmitting pattern TPL, and the first light blocking member BK1 to prevent or substantially prevent damage or contamination of the first wavelength conversion pattern WCL1, the second wavelength conversion pattern WCL2, and the light transmitting pattern TPL. The second capping layer CAP2 may include (or may be made of) an inorganic material. The second capping layer CAP2 may include (or may be made of) the same material as the first capping layer CAP1, or may include (or may be made of) the material exemplified in association with the first capping layer CAP1.

The second planarization layer OC2 may be disposed on the second capping layer CAP2 to flatten the upper ends (or upper surfaces) of the first and second wavelength conversion patterns WCL1 and WCL2 and the light transmitting pattern TPL. The second planarization layer OC2 may include an organic material. For example, the second planarization layer OC2 may include at least one of acrylic resin, epoxy resin, phenolic resin, polyamide resin, or polyimide resin.

The second blocking member BK2 may be disposed on the second planarization layer OC2. The second light blocking member BK2 may be disposed in the light blocking area BA along the boundary of the sub-pixels SPX on the second planarization layer OC2. The second light blocking member BK2 may overlap the first light blocking member BK1 and/or the second bank 600 in the thickness direction (e.g., the third direction DR3) of the display device 10. The second light blocking member BK2 may block or substantially block the emission of light and suppress the reflection of external light. The second light blocking member BK2 may be formed in a grid shape surrounding (or extending around a periphery of) the first to third emission areas LA1, LA2, and LA3 in a plan view.

The second light blocking member BK2 may include (or may contain) an organic material. In an embodiment, the second light blocking member BK2 may include (or may contain) a light absorbing material that absorbs light in a visible light wavelength band. Because the second light blocking member BK2 includes the light absorbing material and is disposed along the boundary of the sub-pixels SPX, the second light blocking member BK2 may define the emission area LA (LA1, LA2, and LA3) of each sub-pixel SPX. For example, the second light blocking member BK2 may be a sub-pixel defining layer for defining the emission area LA of each sub-pixel SPX.

The color filter layer CF may be disposed on the second planarization layer OC2. The color filter layer CF may be disposed on one surface of the second planarization layer OC2 in the area partitioned by the second light blocking member BK2.

The color filter layer CF may include a first color filter CF1, a second color filter CF2, and a third color filter CF3.

The first color filter CF1 may be disposed in the first emission area LA1 of the first sub-pixel SPX1, the second color filter CF2 may be disposed in the second emission area LA2 of the second sub-pixel SPX2, and the third color filter CF3 may be disposed in the third emission area LA3 of the third sub-pixel SPX3. The first to third color filters CF1, CF2, and CF3 may be surrounded by (e.g., surrounded along their peripheries by) the second light blocking member BK2.

The first to third color filters CF1, CF2, and CF3 may include (or may contain) a colorant, such as a dye or pigment, that absorbs wavelengths other than the corresponding color wavelength. The first color filter CF1 may selectively allow the first color light (e.g., red light) to pass therethrough and may block or absorb the second color light (e.g., green light) and the third color light (e.g., blue light). The second color filter CF2 may selectively allow the second color light (e.g., green light) to pass therethrough and may block or absorb the first color light (e.g., red light) and the third color light (e.g., blue light). The third color filter CF3 may selectively allow the third color light (e.g., blue light) to pass therethrough and may block or absorb the first color light (e.g., red light) and the second color light (e.g., green light). For example, the first color filter CF1 may be a red color filter, the second color filter CF2 may be a green color filter, and the third color filter CF3 may be a blue color filter.

The first to third color filters CF1, CF2, and CF3 may absorb a part of the light (e.g., some of the light) coming from the outside of the display device 10 to reduce the reflected external light. Thus, the first to third color filters CF1, CF2, and CF3 may prevent or substantially prevent color distortion caused by the reflection of the external light.

Because the color filter layer CF is disposed on the first and second wavelength conversion patterns WCL1 and WCL2 and the light transmitting pattern TPL through the second planarization layer OC2, the display device 10 may not require a separate substrate for the color filter layer CF. Therefore, the thickness of the display device 10 may be relatively reduced.

The second passivation layer PAS2 may be disposed on the color filter layer CF and the second light blocking member BK2 to cover them. The second passivation layer PAS2 may protect the color filter layer CF.

The encapsulation layer ENC may be disposed on the second passivation layer PAS2. For example, the encapsulation layer ENC may include at least one inorganic film to prevent or substantially prevent permeation of oxygen or moisture. In addition, the encapsulation layer ENC may include at least one organic film to protect the display device 10 from foreign substances, such as dust.

Figure 8:
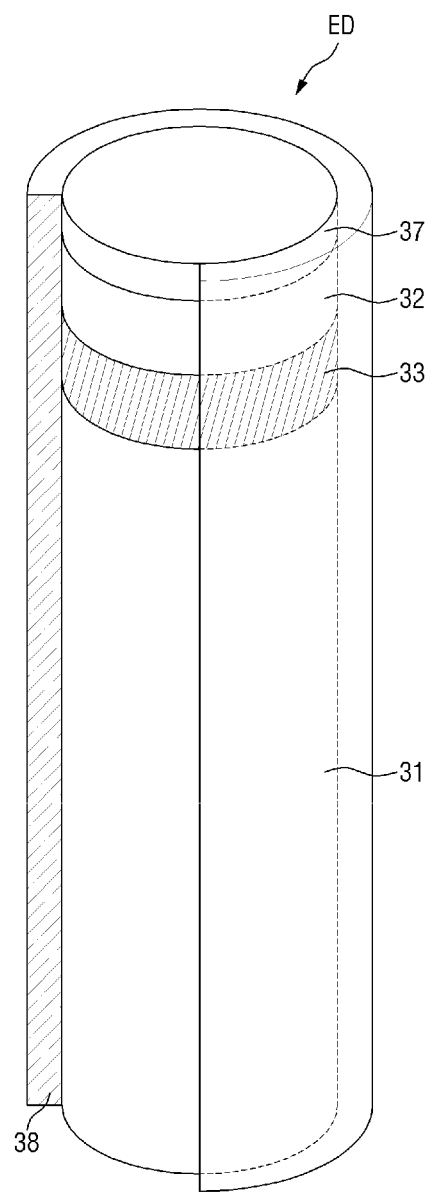
FIG. 8 is a schematic perspective view of a light emitting element according to an embodiment.

FIG. 8 is a schematic perspective view of a light emitting element according to an embodiment.

Referring to FIG. 8, the light emitting element ED, which is a particulate element, may have a rod or cylindrical shape having an aspect ratio (e.g., a predetermined aspect ratio). The length of the light emitting element ED may be larger than the diameter of the light emitting element ED, and the aspect ratio may be in a range of about 1.2:1 to about 100:1, but the present disclosure is not limited thereto.

The light emitting element ED may have a size of a nanometer scale (equal to or greater than 1 nm and less than 1 µm) to a micrometer scale (equal to or greater than 1 µm and less than 1 mm). In an embodiment, both the diameter and the length of the light emitting element ED may be on a nanometer scale or on a micrometer scale. In some other embodiments, the diameter of the light emitting element ED may be on a nanometer scale, while the length of the light emitting element ED may be on a micrometer scale. In some embodiments, some of the light emitting elements ED may have a diameter and/or length on a nanometer scale, while some others of the light emitting elements ED may have a diameter and/or length on a micrometer scale.

The light emitting element ED may include an inorganic light emitting diode. The inorganic light emitting diode may include a plurality of semiconductor layers. For example, the inorganic light emitting diode may include a first conductive (e.g., n-type) semiconductor layer, a second conductive (e.g., p-type) semiconductor layer, and an active semiconductor layer interposed therebetween. The active semiconductor layer may receive holes and electrons from the first conductive semiconductor layer and the second conductive semiconductor layer, respectively, and the holes and electrons that have reached the active semiconductor layer may be coupled to emit light.

In an embodiment, the above-described semiconductor layers may be sequentially stacked along the longitudinal direction of the light emitting element ED. As shown in FIG. 8, the light emitting element ED may include a first semiconductor layer 31, an element active layer 33, and a second semiconductor layer 32 that are sequentially stacked in the longitudinal direction. The first semiconductor layer 31, the element active layer 33, and the second semiconductor layer 32 may be the first conductive semiconductor layer, the active semiconductor layer, and the second conductive semiconductor layer, respectively.

The first semiconductor layer 31 may be doped with a first conductive dopant. The first conductive dopant may be Si, Ge, Sn, or the like. In an embodiment, the first semiconductor layer 31 may be n-GaN doped with n-type Si.

The second semiconductor layer 32 may be spaced apart from the first semiconductor layer 31 with the element active layer 33 interposed therebetween. The second semiconductor layer 32 may be doped with a second conductive dopant, such as Mg, Zn, Ca, Se, Ba, or the like. In an embodiment, the second semiconductor layer 32 may be p-GaN doped with p-type Mg.

The element active layer 33 may include a material having a single or multiple quantum well structure. As described above, the element active layer 33 may emit light by the coupling of electron-hole pairs according to an electrical signal applied through the first semiconductor layer 31 and the second semiconductor layer 32.

In some embodiments, the element active layer 33 may have a structure in which semiconductor materials having large band gap energy and semiconductor materials having small band gap energy are alternately stacked and may include other group III to V semiconductor materials according to the wavelength band of the emitted light.

The light emitted from the element active layer 33 may be projected (or emitted) through both side (or end) surfaces as well as the outer surface of the light emitting element ED in a longitudinal direction. That is, the directionality of light emitted from the element active layer 33 is not limited to one direction.

The light emitting element ED may further include an element electrode layer 37 disposed on the second semiconductor layer 32. The element electrode layer 37 may contact the second semiconductor layer 32. The element electrode layer 37 may be an ohmic contact electrode, but is not limited thereto, and may be a Schottky contact electrode.

When both ends (e.g., opposite ends) of the light emitting element ED are electrically connected to the contact electrodes 710 and 720 to apply an electrical signal to the first and second semiconductor layers 31 and 32, the element electrode layer 37 may be disposed between the second semiconductor layer 32 and the contact electrodes 710 and 720 to reduce resistance. The element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The element electrode layer 37 may include an n-type or p-type doped semiconductor material.

The light emitting element ED may further include an element insulating layer 38 surrounding the outer peripheral surfaces of the first semiconductor layer 31, the second semiconductor layer 32, the element active layer 33, and/or the element electrode layer 37. The element insulating layer 38 is disposed to surround at least the outer surface of the element active layer 33 and may extend in the direction in which the light emitting element ED extends. The element insulating layer 38 may protect the members. Because the element insulating layer 38 includes (or is made of) materials having insulating properties, an electrical short circuit that may occur when the element active layer 33 directly contacts an electrode through which an electrical signal is transmitted to the light emitting element ED may be prevented or substantially prevented. Further, because the element insulating layer 38 protects the outer peripheral surfaces of the first and second semiconductor layers 31 and 32 and the element active layer 33, deterioration in light emission efficiency may be prevented or substantially prevented.

Figure 9:
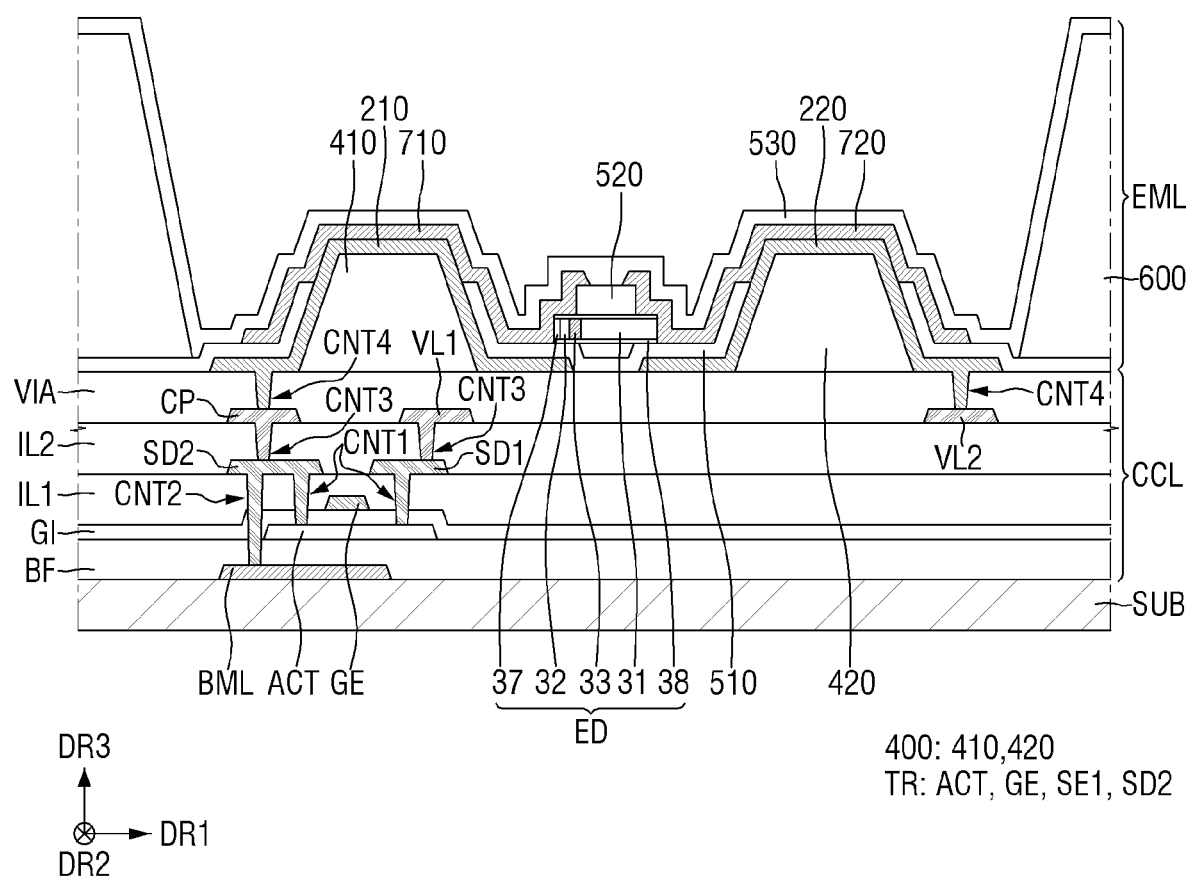
FIG. 9 is an enlarged cross-sectional view of a display device according to an embodiment.

FIG. 9 is an enlarged cross-sectional view of a display device according to an embodiment.

Referring to FIG. 9, the circuit layer CCL may be disposed on the substrate SUB. The circuit layer CCL according to an embodiment may include a lower metal layer BML, a buffer layer BF, a semiconductor layer, a plurality of conductive layers, and a plurality of insulating layers.

The lower metal layer BML may be disposed on the substrate SUB. The lower metal layer BML may be a light blocking layer for protecting an active material layer ACT of the transistor TR from the external light. The lower metal layer BML may include (or may contain) a material that blocks light. For example, the lower metal layer BML may include (or may be formed of) an opaque metal material that blocks or substantially blocks transmission of light.

The lower metal layer BML has a patterned shape. The lower metal layer BML may be disposed to cover at least the channel region of the active material layer ACT of the transistor TR at a position therebelow and may be further disposed to cover the entire active material layer ACT of the transistor TR at a position therebelow. However, the present disclosure is not limited thereto, and the lower metal layer BML may be omitted.

The buffer layer BF may be disposed on the lower metal layer BML. The buffer layer BF may be disposed to cover the entire surface of the substrate SUB on which the lower metal layer BML is disposed. The buffer layer BF may protect the transistor TR from moisture permeating through the substrate SUB, which is susceptible to moisture permeation. The buffer layer BF may include (or may be formed of) a plurality of inorganic layers that are alternately stacked. For example, the buffer layer BF may include (or may be formed of) a multilayer in which inorganic layers, including at least one of silicon oxide ($SiO_x$), silicon nitride ($SiN_x$) and silicon oxynitride ($SiO_xN_y$), are alternately stacked.

The semiconductor layer may be disposed on the buffer layer BF. The semiconductor layer may include the active material layer ACT of the transistor TR. The active material layer ACT of the transistor TR may be disposed to overlap the lower metal layer BML.

The semiconductor layer may include polycrystalline silicon, monocrystalline silicon, oxide semiconductor, and the like. In an embodiment, when the semiconductor layer includes polycrystalline silicon, the polycrystalline silicon may be formed by crystallizing amorphous silicon. When the semiconductor layer includes polycrystalline silicon, the active material layer ACT of the transistor TR may include a plurality of doping regions doped with impurities and channel regions disposed therebetween. In another embodiment, the semiconductor layer may include an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO), or the like.

A gate insulating layer GI may be disposed on the semiconductor layer. The gate insulating layer GI may be a gate insulating layer of the transistor TR. The gate insulating layer GI may include (or may be formed of) an inorganic layer including an inorganic material, such as silicon oxide ($SiO_x$), silicon nitride ($SiN_x$), or silicon oxynitride ($SiO_xN_y$), or a stacked structure thereof.

The first conductive layer may be disposed on the gate insulating layer GI. The first conductive layer may include a gate electrode GE of the transistor TR. The gate electrode GE may be disposed to overlap the channel region of the active material layer ACT in the third direction DR3.

The first conductive layer may be formed as a single layer or as a plurality of layers including (or made of) any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

An interlayer insulating layer IL1 may be disposed on the first conductive layer. The interlayer insulating layer IL1 may be disposed to cover the first conductive layer. The interlayer insulating layer IL1 may include an inorganic insulating material, such as silicon oxide ($SiO_x$), silicon nitride ($SiN_x$), and silicon oxynitride ($SiO_xN_y$).

A second conductive layer is disposed on the interlayer insulating layer IL1. The second conductive layer may include a drain electrode SD1 and a source electrode SD2 of the transistor TR. The second conductive layer may further include a data line.

The drain electrode SD1 and the source electrode SD2 of the transistor TR may be electrically connected to both ends (e.g., the doping regions of the active material layer ACT of the transistor TR) of the active material layer ACT of the transistor TR through first contact openings (e.g., first contact holes) CNT1 penetrating the interlayer insulating layer IL1 and the gate insulating layer GI, respectively. The source electrode SD2 of the transistor TR may be electrically connected to the lower metal layer BML through a second contact opening (e.g., a second contact hole) CNT2 penetrating the interlayer insulating layer IL1, the gate insulating layer GI, and the buffer layer BF.

The second conductive layer may be formed as a single layer or as a plurality of layers including (or made of) any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

The passivation layer IL2 is disposed on the second conductive layer. The passivation layer IL2 covers and protects the second conductive layer. The passivation layer IL2 may include an inorganic insulating material, such as silicon oxide ($SiO_x$), silicon nitride ($SiN_x$), and silicon oxynitride ($SiO_xN_y$).

A third conductive layer is disposed on the passivation layer IL2. The third conductive layer may include a first power supply wiring VL1, a second power supply wiring VL2, and a first conductive pattern CP.

A high potential voltage (e.g., a first source voltage) may be supplied to the first power supply wiring VL1, and a low potential voltage (e.g., a second source voltage) lower than the high potential voltage supplied to the first power supply wiring VL1 may be supplied to the second power supply wiring VL2.

The first power supply wiring VL1 may be electrically connected to the drain electrode SD1 of the transistor TR. The first power supply wiring VL1 may be electrically connected to the drain electrode SD1 of the transistor TR through a third contact opening (e.g., a third contact hole) CNT3 penetrating the passivation layer IL2.

The second power supply wiring VL2 may be electrically connected to the second electrode 220 to supply the low potential voltage (e.g., the second source voltage) to the second electrode 220. The second power supply wiring VL2 may be electrically connected to the second electrode 220 through a fourth contact opening (e.g., a fourth contact hole) CNT4, to be described later, to transmit the second source voltage to the second electrode 220. Further, an alignment signal for aligning the light emitting element ED may be applied to the second power supply wiring VL2 during the manufacturing process of the display device 10.

The first conductive pattern CP may be electrically connected to the source electrode SD2 of the transistor TR through the third contact opening CNT3 penetrating the passivation layer IL2. The first conductive pattern CP may be electrically connected to the first electrode 210 through the fourth contact opening CT4, to be described later, to transmit the first source voltage applied from the first power supply wiring VL1 to the first electrode 210.

The third conductive layer may be formed as a single layer or as a plurality of layers including (or made of) any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

The via layer VIA is disposed on the third conductive layer. The via layer VIA may be disposed on the passivation layer IL2, on which the third conductive layer is disposed. The via layer VIA may flatten the surface (e.g., may provide a flat upper surface). The via layer VIA may include an organic insulating material, for example, an organic material, such as polyimide (PI).

Referring to FIGS. 8 and 9, the light emitting element layer EML may be disposed on the via layer VIA of the circuit layer CCL. The light emitting element layer EML may include the plurality of light emitting elements ED, the first bank 400, the second bank 600, the first and second electrodes 210 and 220, the first and second contact electrodes 710 and 720, and the plurality of insulating layers 510, 520, and 530.

The first bank 400 may be disposed on via layer VIA. The first bank 400 may include the first sub-bank 410 and the second sub-bank 420. The first sub-bank 410 and the second sub-bank 420 may be spaced apart from each other in the first direction DR1. The separation space formed between the first sub-bank 410 and the second sub-bank 420 spaced apart from each other may provide an area where the plurality of light emitting elements EDs are disposed.

The first bank 400 may have a structure in which at least a part of the first bank 400 protrudes upwardly (e.g., one side in the third direction DR3) with respect to the top surface of the via layer VIA. The protruding part of the first bank 400 may have an inclined side surface.

The first bank 400 may change the traveling direction of light emitted from the light emitting element ED that travels toward the inclined side surface of the first bank 400 to an upward direction (e.g., a display direction). In other words, the first bank 400 may be (or may act as) a reflective partition wall that changes the traveling direction of the light emitted from the light emitting element ED to the display direction while providing the space where the light emitting element ED is disposed.

Although the side surface of the first bank 400 is illustrated as having a linear shape, the present disclosure is not limited thereto. For example, the side surface (or outer surface) of the first bank 400 may have a curved semicircular or semi-elliptical shape. In an embodiment, the first bank 400 may include an organic insulating material, such as polyimide (PI), but is not limited thereto.

The first electrode 210 and the second electrode 220 may be disposed on the first bank 400 and the via layer VIA exposed by the first bank 400. For example, the first electrode 210 may be disposed on the first sub-bank 410, and the second electrode 220 may be disposed on the second sub-bank 420.

The first electrode 210 may be disposed on the first sub-bank 410 to cover the outer surface of the first sub-bank 410. The first electrode 210 may extend outwardly from the side surface of the first sub-bank 410 to be disposed on a part of the top surface of the via layer VIA that is exposed by the first sub-bank 410 and the second sub-bank 420 in the area between the first sub-bank 410 and the second sub-bank 420 (e.g., the first electrode 210 may extend beyond an edge of the first sub-bank 410 to be on the top surface of the via layer VIA at an area between the first sub-bank 410 and the second sub-bank 420).

The first electrode 210 may contact the first conductive pattern CP through the fourth contact opening CNT4 penetrating the via layer VIA. The first electrode 210 may be electrically connected to the transistor TR through the first conductive pattern CP.

The second electrode 220 may be disposed on the second sub-bank 420 to cover the outer surface of the second sub-bank 420. The second electrode 220 may extend outwardly from the side surface of the second sub-bank 420 to be disposed on a part of the top surface of the via layer VIA that is exposed by the first sub-bank 410 and the second sub-bank 420 in the area between the first sub-bank 410 and the second sub-bank 420 (e.g., the second electrode 220 may extend beyond an edge of the second sub-bank 420 to be on the top surface of the via layer VIA at an area between the first sub-bank 410 and the second sub-bank 420).

The second electrode 220 may contact the second power supply wiring VL2 through the fourth contact opening CNT4 penetrating the via layer VIA. The second electrode 220 may be electrically connected to the second power supply wiring VL2 through the fourth contact opening CNT4.

The first electrode 210 and the second electrode 220 may be spaced apart from each other in the first direction DR1 such that a part of the via layer VIA is exposed in the area between the first sub-bank 410 and the second sub-bank 420.

The first and second electrodes 210 and 220 may be electrically connected to the light emitting element ED, and a voltage (e.g., a predetermined voltage) may be applied to the first and second electrodes 210 and 220 so that the light emitting element ED emits light. For example, the first and second electrodes 210 and 220 may be electrically connected to the light emitting element ED disposed between the first electrode 210 and the second electrode 220 through the first and second contact electrodes 710 and 720, to be described later, respectively, and the electrical signals applied to the first and second electrodes 210 and 220 may be transmitted to the light emitting element ED through the first and second contact electrodes 710 and 720, respectively.

The first and second electrodes 210 and 220 may include (or may contain) a transparent conductive material. For example, each of the first and second electrodes 210 and 220 may include a material, such as indium tin oxide (ITO), indium zinc oxide (IZO), and indium tin zinc oxide (ITZO), but is not limited thereto. In some other embodiments, the first and second electrodes 210 and 220 may include a conductive material having high reflectivity. For example, the first and second electrodes 210 and 220 may include, as a material having high reflectivity, metal, such as silver (Ag), copper (Cu), or aluminum (Al). In such an embodiment, the first and second electrodes 210 and 220 may reflect the light emitted from the light emitting element ED that travels toward the side surface of the first bank 400 to travel in the display direction. Without being limited thereto, the first and second electrodes 210 and 220 may have a structure in which at least one transparent conductive material and at least one metal layer having high reflectivity are stacked, or may be formed as one layer including them. In an embodiment, the first and second electrodes 210 and 220 may have a stacked structure, such as ITO/Ag/ITO, ITO/Ag/IZO, or ITO/Ag/ITZO/IZO, or may be an alloy including aluminum (Al), nickel (Ni), lanthanum (La), or the like.

The first insulating layer 510 may be disposed on the first and second electrodes 210 and 220. The first insulating layer 510 is disposed on the first electrode 210 and the second electrode 220 to expose at least a part of the first electrode 210 and the second electrode 220. The first insulating layer 510 may be formed entirely on one surface of the substrate SUB, including the area between the first electrode 210 and the second electrode 220, to expose a part of the first electrode 210 and the second electrode 220.

The first insulating layer 510 may protect the first electrode 210 and the second electrode 220 and insulate them from each other. Further, the light emitting element ED disposed on the first insulating layer 510 may not be damaged by direct contact with other members.

The second bank 600 may be formed to have a height greater than that of the first bank 400. The second bank 600 may prevent or substantially prevent an ink from overflowing to adjacent pixels during an inkjet printing process for aligning the light emitting elements ED in the manufacturing process of the display device 10. In an embodiment, the second bank 600 may include an organic insulating material, such as polyimide (PI), but is not limited thereto.

The light emitting element ED may be disposed on the first insulating layer 510 between the first electrode 210 and the second electrode 220 such that one end thereof is located on the first electrode 210 and the other end thereof is located on the second electrode 220.

The light emitting element ED may have a shape extending in one direction. Although not limited to the following, the extension direction of the light emitting element ED may be substantially parallel to one surface of the substrate SUB. In the light emitting element ED, the first semiconductor layer 31, the element active layer 33, the second semiconductor layer 32, and the element electrode layer 37 may be sequentially formed in the direction parallel to one surface of the substrate SUB in cross-sectional view through both ends of the light emitting element ED.

A second insulating layer 520 may be partially disposed on the light emitting element ED. The second insulating layer 520 may be disposed on the light emitting element ED disposed between the first electrode 210 and the second electrode 220 to expose both ends of the light emitting element ED. The second insulating layer 520 may be disposed to partially surround the outer surface of the light emitting element ED. The second insulating layer 520 may protect the light emitting element ED and also fix the light emitting element ED in a manufacturing process of the display device 10.

The first contact electrode 710 and the second contact electrode 720 may be disposed on the second insulating layer 520. The first contact electrode 710 and the second contact electrode 720 may be spaced apart from each other and disposed to face each other in the first direction DR1. The first contact electrode 710 and the second contact electrode 720 may be spaced apart from each other in the first direction DR1 on the second insulating layer 520.

The first contact electrode 710 may be disposed on the first electrode 210. The first contact electrode 710 may contact the first electrode 210 exposed by the first insulating layer 510 and may contact one end of the light emitting element ED exposed by the second insulating layer 520. Because the first contact electrode 710 contacts the first electrode 210 and one end of the light emitting element ED, it may electrically connect the light emitting element ED to the first electrode 210.

The second contact electrode 720 may be disposed on the second electrode 220. The second contact electrode 720 may contact the second electrode 220 exposed by the first insulating layer 510 and may contact the other end of the light emitting element ED exposed by the second insulating layer 520. The second contact electrode 720 may contact the other end of the light emitting element ED and the second electrode 220 to electrically connect the light emitting element ED to the second electrode 220.

For example, one end of the light emitting element ED exposed by the second insulating layer 520 may be electrically connected to the first electrode 210 through the first contact electrode 710, and the other end of the light emitting element ED may be electrically connected to the second electrode 220 through the second contact electrode 720.

The first and second contact electrodes 710 and 720 may include a conductive material. For example, the first contact electrode 710 and the second contact electrode 720 may include (or may contain) ITO, IZO, ITZO, aluminum (Al), or the like. The first and second contact electrodes 710 and 720 may include, but may not necessarily include, a transparent conductive material.

The third insulating layer 530 may be disposed on the entire substrate SUB. The third insulating layer 530 may protect the members disposed on the substrate SUB against the external environment.

Figure 10:
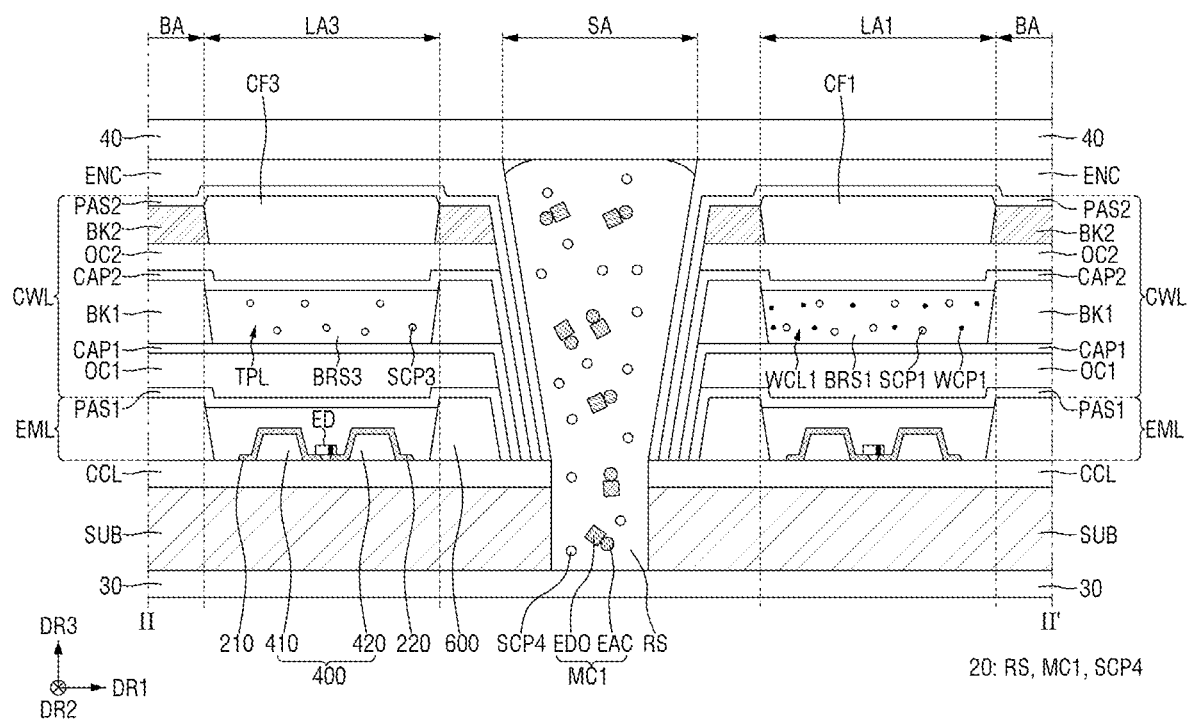
FIG. 10 is a cross-sectional view of a display device taken along the line II-II' of FIG. 3.

FIG. 10 is a cross-sectional view taken along the line II-II' of FIG. 3.

Referring to FIG. 10, the thermally variable member 20 may be disposed between the display devices 10 on the lower plate 30. The thermally variable member 20 may be disposed to fill the boundary area SA between the display devices 10. The thermally variable member 20 may be disposed in the boundary area SA to cover the side surfaces of the display devices 10. The thermally variable member 20 may be disposed to cover at least the side surfaces of the light emitting element layers EML and the color control layers CWL of the display devices 10.

As described above, the thermally variable member 20 may include the resin RS, the thermochromic material MC, and the light diffuser SCP4. The thermochromic material MC may include a first thermochromic material MC1, whose color and/or transparency varies (or is changed) depending on a temperature.

The first thermochromic material MC1 may include an electron donor EDO and an electron acceptor EAC. The electron donor EDO and the electron acceptor EAC of the first thermochromic material MC1 may be coupled or separated depending on the temperature of the thermally variable member 20. For example, the electron donor EDO and the electron acceptor EAC of the first thermochromic material MC1 may be separated from each other and become transparent when the temperature of the thermally variable member 20 is increased and may be combined with each other and exhibit black when the temperature of the thermally variable member 20 is decreased.

The resin RS of the thermally variable member 20 may be included within a range of about 20% by weight to about 50% by weight with respect to the total amount of the thermally variable member 20. Further, the light diffuser SCP4 of the thermally variable member 20 may be included within a range of about 30% by weight to about 50% by weight with respect to the total amount of the thermally variable member 20. The first thermochromic material MC1 of the thermally variable member 20 may be included within a range of about 20% by weight to about 30% by weight with respect to the total amount of the thermally variable member 20.

Figure 11:
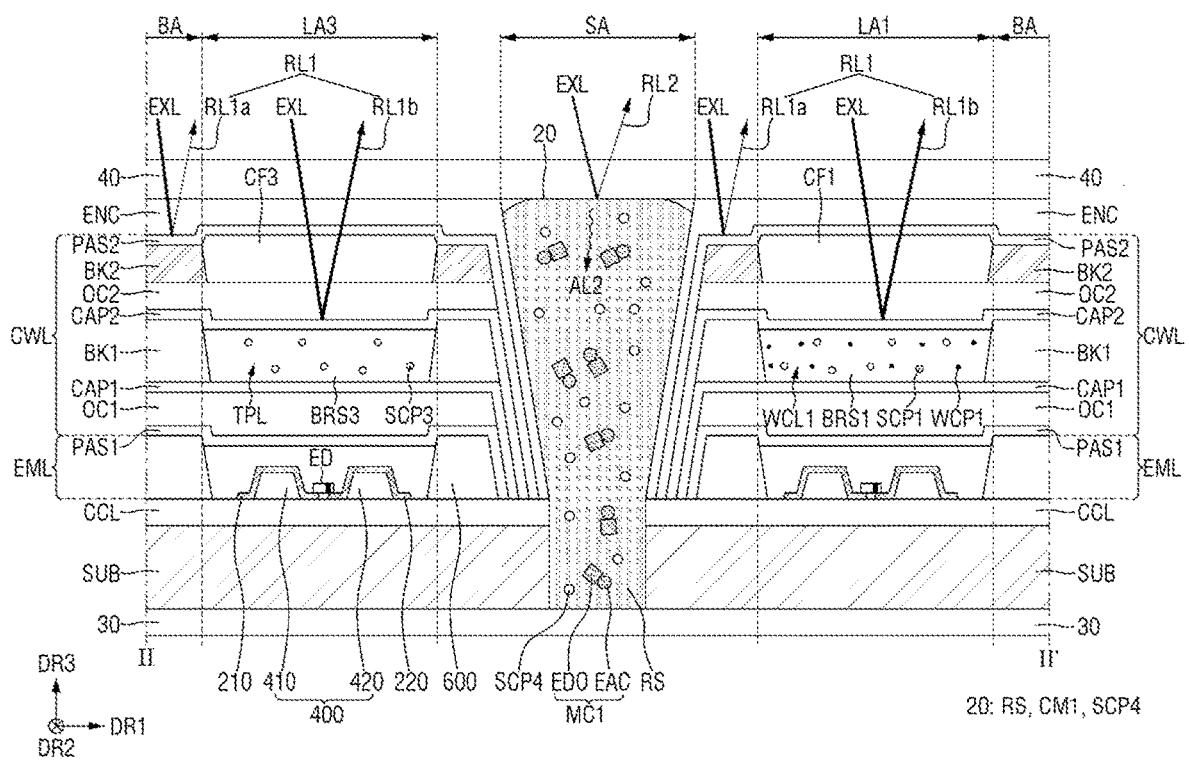
FIGS. 11 and 12 are cross-sectional views illustrating the reflectance of external light and the light transmittance in the on state and the off state of the tiled display device shown in FIG. 10.
Figure 12:
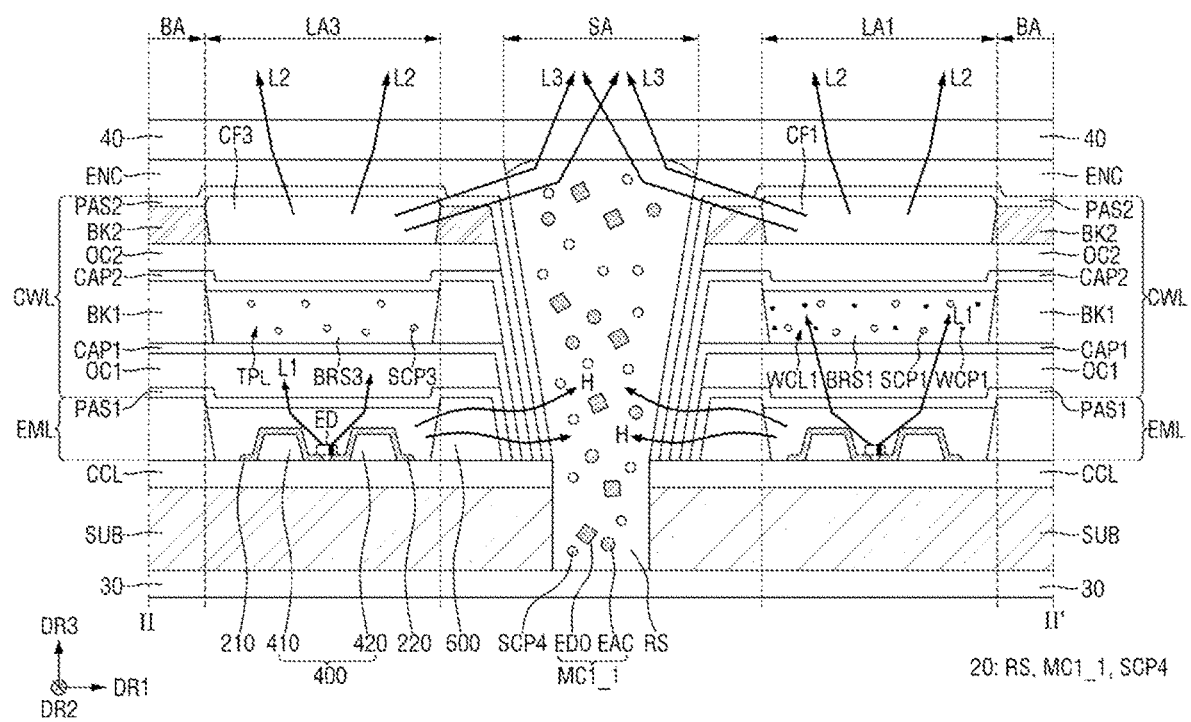

FIGS. 11 and 12 are cross-sectional views illustrating the reflectance of external light and the light transmittance in the off state and the on state of the tiled display device shown in FIG. 10.

FIG. 11 shows a the plurality of display devices 10 in the off state, and FIG. 12 shows the plurality of display devices 10 in the on state.

Referring to FIG. 11, the temperature of the display device 10 may be lower than or equal to the first reference temperature when the display device 10 is in the off state. For example, the first reference temperature may be within a range from about 45° C. to about 60° C. When the temperature of the display device 10 is lower than or equal to the first reference temperature, the temperature of the thermally variable member 20 including the first thermochromic material MC1 may be lower than or equal to the first reference temperature. Therefore, the electron donor EDO and the electron acceptor EAC of the first thermochromic material MC1 may be coupled to each other as shown in FIG. 11. Therefore, the first thermochromic material MC1 may exhibit black.

When the plurality of display devices 10 are in the off state, the reflectance of external light of the display device 10 and the reflectance of external light of the thermally variable member 20 may be similar. For example, the reflectance of external light of the display device 10 may be about 1% or less in the off state, and the reflectance of external light of the thermally variable member 20 may be about 5% or less in the off state. The difference between the reflectance of external light of the display device 10 and the reflectance of external light of the thermally variable member 20 may be about 4% or less in the off state.

Because the thermally variable member 20 includes the light diffuser SCP4, a part of (some of) the external light EXL incident on the thermally variable member 20 may be reflected by the light diffuser SCP4. Further, because the first wavelength conversion pattern WCL1, the second wavelength conversion pattern WCL2, and the light transmitting pattern TPL respectively disposed in the first to third emission areas LA1, LA2, and LA3 of the display device 10 include the first to third scatterers SCP1, SCP2, and SCP3, respectively, a part of (some of) the external light EXL incident on the display device 10 may be reflected.

The first reflected light RL1 of the display device 10 may include a reflected light RL1b of the plurality of emission areas LA including a light scattering material, and a reflected light RL1a of the light blocking area BA containing no light scattering material. The light blocking area BA may correspond to the first light blocking member BK1 and/or the second light blocking member BK2. The plurality of emission areas LA may correspond to the wavelength conversion layer WCL and the light transmitting pattern TPL or the color filter layer CF. The reflectance of external light of the display device 10 may be the same or substantially the same as the average value of the reflectance of external light of the emission area LA and the reflectance of external light of the light blocking area BA.

The reflectance of external light from the thermally variable member 20 may be lower than the reflectance of external light from the plurality of emission areas LA of the display device 10 and may be higher than the reflectance of external light from the light blocking area BA. Even when the light diffuser SCP4 of the thermally variable member 20 and the first to third scatterers SCP1, SCP2, and SCP3 of the display device 10 include the same material, the thermally variable member 20 exhibits black in the off state. Therefore, the reflectance of external light of the thermally variable member 20 may be lower than the reflectance of external light from the emission area LA of the display device 10 and may be higher than the reflectance of external light from the light blocking area BA. Therefore, because the thermally variable member 20 includes the first thermochromic material MC1, the boundary area SA exhibits black in the off state. Accordingly, the reflectance of external light may be reduced compared to an embodiment in which the light diffuser SCP4 is disposed in the boundary area SA. Therefore, because the thermally variable member 20 disposed in the boundary area SA exhibits black in the off state, the difference between the reflectance of external light of the display device 10 and the reflectance of external light of the thermally variable member 20 in the boundary area SA of the display device 10 may be reduced.

Referring to FIG. 12, when the display device 10 is in the on state, the light emitting element layer EML of the display device 10 may emit the first light L1. The partial light L2 of the first light L1 may be emitted to the outside of the tiled display device TD through the color control layer CWL of the display device 10, and another partial light L3 of the first light L1 may be incident on the boundary area SA between the display devices 10.

Heat H may be generated in the display device 10 as the first light L1 is emitted from the light emitting element layer EML in the on state. The temperature in the display device 10 may be increased by the heat H. Further, the heat H generated in the display device 10 may be transferred to the thermally variable member 20 disposed on the side surface of the display device 10. Therefore, the temperature of the thermally variable member 20 may be increased by the heat H generated in the display device 10. The temperature of the display device 10 in the on state may exceed the first reference temperature. When the temperature of the display device 10 exceeds the first reference temperature, the temperature of the thermally variable member 20 including a first thermochromic material MC1_1 may exceed the first reference temperature. Therefore, the electron donor EDO and the electron acceptor EAC of the first thermochromic material MC1_1 may be separated from each other as shown in FIG. 12. Therefore, the first thermochromic material MC1_1 may be transparent.

Because the resin RS in which the first thermochromic material MC1_1 is dispersed and the first thermochromic material MC1_1 are transparent, the third light L3 that has traveled to the boundary area SA between the display devices 10 may be emitted to the outside of the tiled display device TD while transmitting the thermally variable member 20. Further, the third light L3 may be diffused by the light diffuser SCP4 in the thermally variable member 20. Therefore, the phenomenon in which an image is disconnected in the boundary area SA between the plurality of display devices 10 of the tiled display device TD in the on state may be avoided and the boundary area SA may not be recognized by a user.

Figure 13:
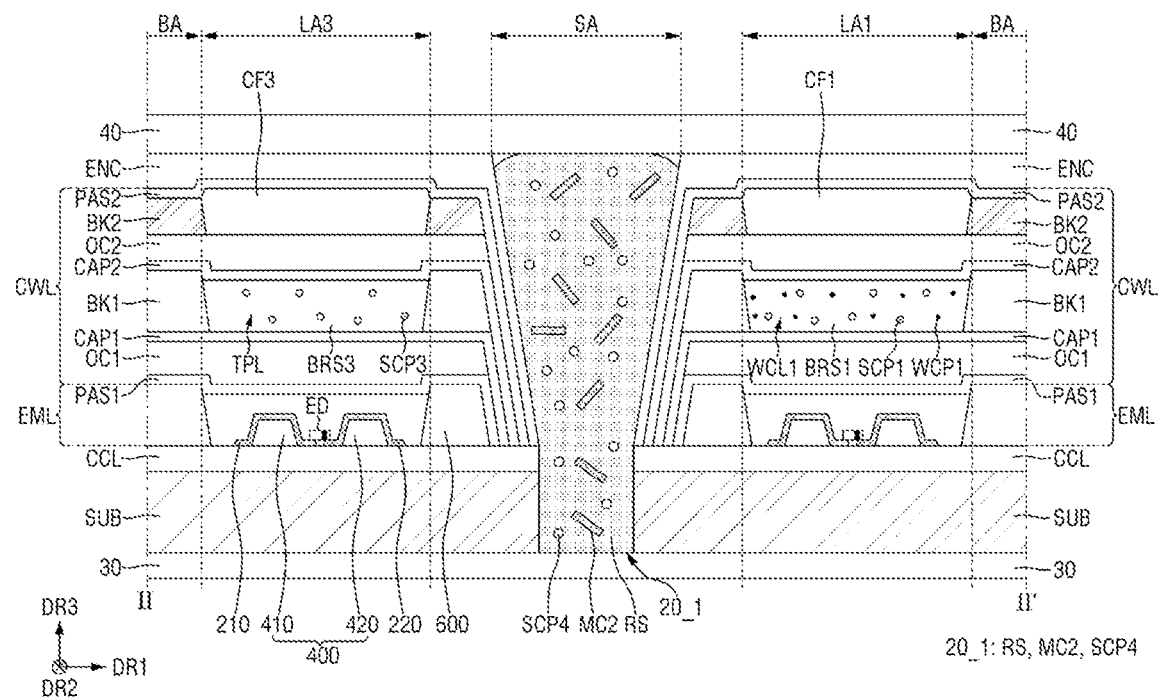
FIG. 13 is a cross-sectional view illustrating a display device taken along the line II-II' of FIG. 3 according to another embodiment.
Figure 14:
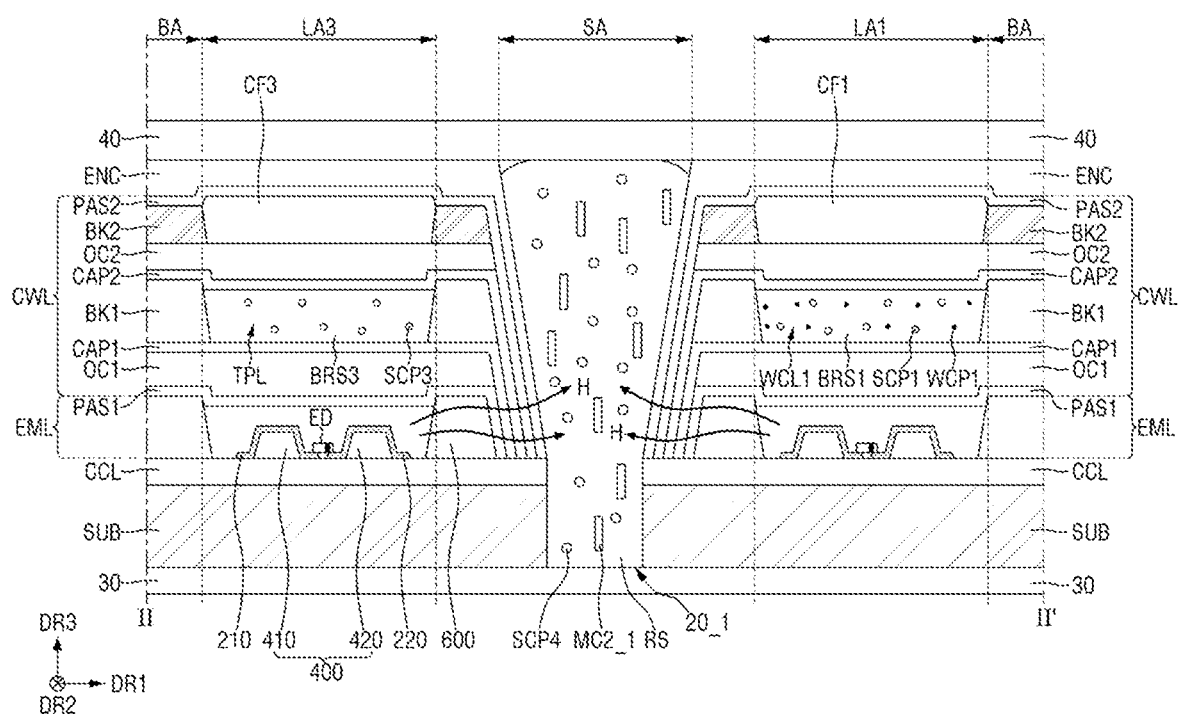
FIG. 14 is a cross-sectional view illustrating an arrangement of thermochromic material in the on state of the tiled display device shown in FIG. 13.

FIG. 13 is a cross-sectional taken along the line II-II' of FIG. 3 according to another embodiment, and FIG. 14 is a cross-sectional view illustrating the arrangement of the thermochromic material in the on state of the tiled display device shown in FIG. 13.

Referring to FIGS. 13 and 14, a thermally variable member 20_1 according to the present embodiment may include the resin RS, a second thermochromic material MC2, and the light diffuser SCP4. The alignment of particles in the second thermochromic material MC2 may be changed depending on a temperature, and the color and/or the light transmittance of the second thermochromic material MC2 may be changed depending on the alignment of the particles. For example, the second thermochromic material MC2 may be regularly arranged when the temperature of the thermally variable member 20_1 is increased and may be randomly arranged when the temperature of the thermally variable member 20_1 is decreased. When the second thermochromic material MC2 is regularly arranged, the second thermochromic material MC2 may be transparent. When the second thermochromic material MC2 is randomly arranged, the second thermochromic material MC2 may exhibit black.

Therefore, because the temperature of the display device 10 is lower than or equal to the first reference temperature in the off state as described above, the temperature of the thermally variable member 20_1 including the second thermochromic material MC2 may be lower than or equal to the first reference temperature. Therefore, the second thermochromic material MC2 may be randomly arranged as shown in FIG. 13. Therefore, the second thermochromic material MC2 may exhibit black.

Further, because the temperature of the display device 10 exceeds the first reference temperature in the on state as described above, the temperature of the thermally variable member 20_1 including the second thermochromic material MC2 may exceed the first reference temperature. Therefore, the second thermochromic material MC2 may be regularly arranged as shown in FIG. 14. Therefore, the second thermochromic material MC2 may be transparent.

In the present embodiment, the boundary area SA of the tiled display device TD may not be recognized by a user by controlling the optical characteristics of the boundary area SA of the tiled display device TD depending on the on/off state of the display device 10 using the characteristic that the arrangement of the second thermochromic material MC2 is changed depending on a temperature.

Although embodiments of the present invention have been disclosed herein for illustrative purposes, those skilled in the art will appreciate that various modifications, additions, and substitutions are possible without departing from the scope and spirit of the present disclosure as disclosed in the accompanying claims and their equivalents.

What is claimed is:

1. A tiled display device comprising:
a plurality of display devices, each of the display devices comprising a substrate anda plurality of pixels on the substrate; and
a thermally variable member between adjacent ones of the substrates of the plurality of display devices, the thermally variable member comprising a material whose light transmittance is different depending on a temperature.

2. The tiled display device of claim 1, wherein the thermally variable member comprises a thermochromic material.

3. The tiled display device of claim 2, wherein the thermally variable member further comprises a resin and light scattering particles, and
wherein the thermochromic material and the light scattering particles are dispersed in the resin.

4. The tiled display device of claim 3, wherein the thermally variable member comprises: the resin within a range of 20% by weight to 50% by weight; the light scattering particles within a range of 30% by weight to 50% by weight; and the thermochromic material within a range of 20% by weight to 30% by weight.

5. The tiled display device of claim 2, wherein the thermochromic material exhibits a black color at a temperature lower than or equal to a first reference temperature, and
wherein the thermochromic material is transparent at a temperature exceeding the first reference temperature.

6. The tiled display device of claim 5, wherein an external light reflectance of the display device has a range of 1% or less at the temperature lower than or equal to the first reference temperature, and
wherein an external light reflectance of the thermally variable member has a range of 5% or less at the temperature lower than or equal to the first reference temperature.

7. The tiled display device of claim 5, wherein the thermochromic material is configured to experience a reversible a light transmittance change at the first reference temperature.

8. The tiled display device of claim 1, wherein a light transmittance of the thermally variable member increases as its temperature increases.

9. The tiled display device of claim 8, wherein the thermally variable member has an external light reflectance of 5% or less at a temperature lower than or equal to a first reference temperature, and
wherein the thermally variable member has a light transmittance of 80% or more at a temperature higher than or equal to the first reference temperature.

10. The tiled display device of claim 9, wherein the first reference temperature has a range of 45° C. to 60° C.

11. The tiled display device of claim 9, wherein a difference between an external light reflectance of the display device and the external light reflectance of the thermally variable member at the temperature lower than or equal to the first reference temperature has a range of 4% or less.

12. The tiled display device of claim 11, wherein the display device has a plurality of emission areas and a light blocking area extending around a periphery of the emission areas, and
wherein the external light reflectance of the display device is equal to an average value of an external light reflectance of the emission areas and an external light reflectance of the light blocking area.

13. The tiled display device of claim 1, wherein the thermally variable member is on a side surface of the display device between the plurality of display devices.

14. The tiled display device of claim 13, wherein the thermally variable member covers the side surface of the display device.

15. A tiled display device comprising:
a first display device having a plurality of emission areas and a light blocking area extending around a periphery of the emission areas;
a second display device spaced apart from the first display device and having a plurality of emission areas and a light blocking area extending around a periphery of the emission areas; and
a thermally variable member on each side surface of the first display device and the second display device facing and being spaced apart from each other between the first display device and the second display device,
wherein the thermally variable member comprises a material whose light transmittance is different depending on a temperature.

16. The tiled display device of claim 15, wherein the thermally variable member comprises a thermochromic material.

17. The tiled display device of claim 16, wherein the thermochromic material exhibits a black color at a temperature lower than or equal to a first reference temperature, and
wherein the thermochromic material is transparent at a temperature exceeding the first reference temperature.

18. The tiled display device of claim 15, wherein a light transmittance of the thermally variable member increases as its temperature increases.

19. The tiled display device of claim 18, wherein the thermally variable member has an external light reflectance of 5% or less at a temperature lower than or equal to a first reference temperature, and wherein the thermally variable member has a light transmittance of 80% or more at a temperature higher than or equal to the first reference temperature.

20. The tiled display device of claim 19, wherein an external light reflectance of the first and second display devices is equal to an average value of an external light reflectance of each emission area of the first and second display devices and an external light reflectance of each light blocking area of the first and second display devices, respectively, and wherein a difference between the external light reflectance of the first and second display devices and the external light reflectance of the thermally variable member at the temperature lower than or equal to the first reference temperature has a range of 4% or less.

* * * * *